United States Patent
Beattie et al.

(10) Patent No.: US 7,096,174 B2
(45) Date of Patent: Aug. 22, 2006

(54) SYSTEMS, METHODS AND COMPUTER PROGRAM PRODUCTS FOR CREATING HIERARCHICAL EQUIVALENT CIRCUIT MODELS

(75) Inventors: Michael W. Beattie, Pittsburgh, PA (US); Lawrence T. Pileggi, Pittsburgh, PA (US)

(73) Assignee: Carnegie Mellon University, Pittsburgh, PA (US)

( * ) Notice: Subject to any disclaimer, the term of this patent is extended or adjusted under 35 U.S.C. 154(b) by 764 days.

(21) Appl. No.: 09/907,334

(22) Filed: Jul. 17, 2001

(65) Prior Publication Data
US 2003/0069722 A1    Apr. 10, 2003

(51) Int. Cl.
G06F 17/50 (2006.01)
G06G 3/10 (2006.01)
(52) U.S. Cl. .......................................... 703/14; 716/18
(58) Field of Classification Search .................. 703/2, 703/14; 327/473, 464; 364/468; 716/10, 716/13, 9, 18
See application file for complete search history.

(56) References Cited

U.S. PATENT DOCUMENTS

| | | | | | |
|---|---|---|---|---|---|
| 4,819,150 | A * | 4/1989 | Jennings et al. | ............... | 703/21 |
| 5,313,398 | A * | 5/1994 | Rohrer et al. | .................. | 703/14 |
| 5,379,231 | A * | 1/1995 | Pillage et al. | .................. | 703/14 |
| 5,500,905 | A * | 3/1996 | Martin et al. | ................ | 382/157 |
| 5,818,764 | A * | 10/1998 | Yiu et al. | ............... | 365/185.11 |
| 6,009,252 | A * | 12/1999 | Lipton | ............................ | 716/5 |
| 6,031,986 | A * | 2/2000 | Milsom | ........................ | 703/14 |
| 6,230,299 | B1 * | 5/2001 | McSherry et al. | .............. | 716/1 |
| 6,230,301 | B1 * | 5/2001 | Weber | ............................ | 716/4 |
| 6,324,493 | B1 * | 11/2001 | Belk | ............................ | 703/13 |
| 6,336,269 | B1 * | 1/2002 | Eldridge et al. | ............... | 29/885 |
| 6,353,801 | B1 * | 3/2002 | Sercu et al. | ................... | 702/65 |
| 6,370,677 | B1 * | 4/2002 | Carruthers et al. | ............. | 716/8 |
| 6,397,171 | B1 * | 5/2002 | Belk | ............................ | 703/14 |
| 6,577,992 | B1 * | 6/2003 | Tcherniaev et al. | ........... | 703/14 |
| 6,718,520 | B1 * | 4/2004 | Merryman et al. | ............. | 716/1 |
| 6,931,616 | B1 * | 8/2005 | Teig et al. | ..................... | 716/13 |

OTHER PUBLICATIONS

Zhao et al, "Hierarchical analysis of power distribution networks", Proceedings of the 37th conference on Design automation, Los Angeles, California, pp. 150-155, Jun. 2000.*

(Continued)

Primary Examiner—Paul L. Rodriguez
Assistant Examiner—Tom Stevens
(74) Attorney, Agent, or Firm—Myers Bigel Sibley & Sajovec, P.A.

(57) ABSTRACT

Systems, methods and computer program products create an equivalent circuit of electric and/or electronic circuit components, by identifying groups of components and hierarchically modeling aggregate interactions among the groups of components, to create increasingly higher level circuit models, until the equivalent circuit for the components is produced. Hierarchical modeling is provided by defining global components that reflect aggregate parameters of the groups of components and modeling the aggregate interaction among the groups of components as interactions among the global components. Moreover, next higher level global components also are defined that reflect aggregate parameters of at least some of the global components, and the aggregate interaction among the groups of components is modeled as interactions among the next higher level global components. The groups of components may be remote from one another and the hierarchical modeling includes hierarchical modeling of aggregate parasitic couplings among the groups of components.

57 Claims, 12 Drawing Sheets

OTHER PUBLICATIONS

Beattie et al, "Electromagnetic Parasitic Extraction via a Multipole Method with Hierarchical Refinement", Proceedings of the 1999 IEEE/ACM international conference on Computer-aided design, San Jose, California, pp. 437-444, Nov. 1999.*

Kamon et al, "Interconnect parasitic extraction in the digital IC design methodology", Computer-Aided Design, 1999. Digest of Technical Papers. 1999 IEEE/ACM International Conference on , Nov. 7-11, 1999, pp. 223-230.*

Lee.T.B, "Efficient Seris Impedance Extraction using Effective Internal Impedance" 1996. Phd. Dissertation Univ. of Texas. p. 1-11.*

Beattie et al., "Hierarchical Interconnect Circuit Models" Citation and Abstract. Aug. 2000. p. 1-2.*

Liu et al., "Model Order-Redution of RC(L) Interconnect Including Variation Analysis". p. 1-2. 1999.*

Beattie et al., *Hierarchical Interconnect Circuit Models*, Computer Aided Design, 2000, ICCAD-2000, IEEE/ACM International Conference 2000, pp. 215-221.

Beattie et al., *IC Analyses Including Extracted Inductance Models*, 36th Design Automation Conference, Proceedings, 1999, pp. 915-920.

Shi et al., *A Fast Hierarchical Algorithm for 3-D Capacitance Extraction*, 35th Design Automation Conference, 1998, pp. 212-217.

Kamon et al., *FASTHENRY: A Multipole-Accelerated 3-D Inductance Extraction Program*, IEEE Transactions on Microwave Theory and Techniques, vol. 42, No. 9, Sep. 1994, pp. 1750-1758.

Nabors et al., *FastCap: A Multipole Accelerated 3-D Capacitance Extraction Program*, IEEE Transactions on Computer-Aided Design, vol. 10, No. 11, Nov. 1991, pp. 1447-1459.

Hanrahan et al., *A Rapid Hierarchical Radiosity Algorithm*, Computer Graphics, vol. 25, No. 4, Jul. 1991, pp. 197-206.

Nagel et al., *Computer Analysis of Nonlinear Circuits, Excluding Radiation (CANCER)*, IEEE Journal of Solid-State Circuits, vol. SC-6, No. 4, Aug. 1971, pp. 166-182.

* cited by examiner

SYSTEMS, METHODS AND COMPUTER PROGRAM PRODUCTS FOR CREATING HIERARCHICAL EQUIVALENT CIRCUIT MODELS

FIELD OF THE INVENTION

This invention relates to the design, layout, testing and manufacture of microelectronic circuits and systems, and more particularly to systems, methods and computer program products for creating equivalent circuits of electric and/or electronic circuit components.

BACKGROUND OF THE INVENTION

Simulation has long been used in the design and manufacture of microelectronic circuits and systems. Present day Ultra-Large Scale Integration (ULSI) devices may include up to hundreds of thousands, millions or more passive electric components and/or active electronic components in a microelectronic device, such as an integrated circuit chip, which are interconnected on the chip to perform a particular function. The large capital investment that generally is needed to fabricate microelectronic devices and the potential difficulty in reworking microelectronic devices which do not operate as planned, may increase the need to simulate circuit performance before manufacture.

Accordingly, many circuit simulators have been developed and marketed. Circuit simulators are typically software based, and are designed to accept a description of the circuit which defines the circuit topology and element values. Each element in the circuit is typically specified by an element line containing the element name, connected nodes, and electrical parameter values. Simulators typically simulate circuits which contain passive (electric) components such as resistors, capacitors, inductors, mutual inductors, interconnects, voltage sources and current sources, and active (electronic) components such as diodes, bipolar junction transistors (BJT), junction field effect transistors (JFET) and metal oxide semiconductor field effect transistors (MOSFET). The simulator can typically be configured to generate a resistive-inductive-capacitive (RLC) equivalent circuit of the microelectronic device and to perform DC analysis, AC small signal analysis and/or transient analysis.

As the feature size of integrated circuits continues to shrink, and operating speeds increase, the characterization of the parasitic effects among the passive and active components may become difficult. For example, technology improvements for integrated circuits can continually decrease minimal feature sizes such that the task of modeling short-range parasitic interconnect couplings may become increasingly complex. The same technology improvements can facilitate larger integrated circuits/systems that are realized via component-based design methods to cope with design complexity and time-to-market constraints. The parasitics and the component based methods may make it desirable to model couplings between large portions of an integrated circuit chip for which the individual interconnect-to-interconnect couplings may be largely insignificant but the collective effect of all couplings may be important. Hierarchical models for interconnect parasitics therefore may become desirable for such systems.

At the lowest levels of modeling detail, hierarchical approaches have been used for interconnect parasitic extraction via a fast multipole method and a hierarchical refinement method. See, Greengard, *The Rapid Evaluation of Potential Fields in Particle Systems*, The MIT Press, Cambridge, Mass., 1987, and Nabors et al., *FastCap: A Multipole Accelerated 3-D Capacitance Extraction Program*, IEEE Trans. CAD, Vol. 10, No. 11, November 1991, pp. 1447–1459, respectively. These strategies can reduce the extraction complexity, usually to order linear in the number of source objects in the system. Conceptually this complexity reduction is made possible by representing the collective couplings/interactions between groups of conductors. Unfortunately, this hierarchy may be destroyed when the RLC equivalent circuit models are created for simulation.

More specifically, to map the extraction models to equivalent circuits, the far away coupling terms are typically discarded, or treated as couplings to ground. However, with the increasing dominance of coupling capacitance, and the emergence of on-chip inductance, modeling and design management of electromagnetic interactions between interconnects may become increasingly important. Even though the individual couplings between interconnect segments in adjacent components can be inconsequential, the composite couplings between the collective interconnects in each component can have a significant impact on performance. In addition, truncation of far field couplings to localize parasitic couplings can cause instabilities in the localized models. See, for example, Beattie et al., *IC Analyses Including Extracted Inductance Models*, $36^{th}$ Design Automation Conference (DAC), June 1999.

In some cases design rules and rigid design practices can be enforced so that simpler models and analyses can be applied for final design verification. However, even in such cases, some understanding of the exact solution and the actual electromagnetic couplings, may be desired to validate the design rules.

SUMMARY OF THE INVENTION

Embodiments of the present invention provide systems, methods and computer program products for creating an equivalent circuit of a plurality of electric and/or electronic circuit components, by identifying groups of components from the plurality of electric and/or electronic components, and hierarchically modeling aggregate interactions among the groups of components, to create increasingly higher level circuit models, until the equivalent circuit for the plurality of components is produced. In some embodiments, hierarchical modeling is provided by defining a plurality of global components that reflect aggregate parameters of the groups of components and modeling the aggregate interaction among the groups of components as a plurality of interactions among the plurality of global components. Moreover, in some embodiments, a plurality of next higher level global components is defined that reflect aggregate parameters of at least some of the plurality of global components, and the aggregate interaction among the groups of components is modeled as a plurality of interactions among the plurality of next higher level global components. In some embodiments, the groups of components are remote from one another and the hierarchical modeling includes hierarchical modeling of aggregate parasitic couplings among the groups of components.

Other embodiments of the present invention create an equivalent circuit of a plurality of electric and/or electronic circuit components by identifying a first group of components and a second group of components that may be remote from the first group of components, from the plurality of electric and/or electronic components. At least one first global component and at least one second global component is defined, that have global component parameters that reflect aggregate parameters of the first group of components and the second group of components, respectively. Aggregate interaction between the first group of components and the second group of components is modeled as a plurality of interactions between the at least one first global component and the at least one second global component. An equivalent circuit for the plurality of components is created using the first and second groups of components, the at least one first global component, the at least one second global component and the interactions between the at least one first global component and the at least one second global component that are modeled.

Moreover, according to other embodiments of the invention, an equivalent circuit is created by further defining at least one third global component that has global component parameters that reflect aggregate parameters of the first and second groups of components, and the at least one first and second global components. Aggregate interaction among the first and second groups of components and others of the plurality of components are modeled as a plurality of interactions between the at least one third global component and the others of the plurality of components. An equivalent circuit of the plurality of components is created using the at least one third global component. Accordingly, hierarchical creation of an equivalent circuit may be provided.

Other embodiments of the invention may be used to create an equivalent circuit of a plurality of interconnects in the microelectronic device, such as a printed circuit board or integrated circuit chip. A first group of interconnects in the microelectronic device is identified. A second group of interconnects in the microelectronic device also is identified. Aggregate parasitic coupling of the first group of interconnects to the second group of interconnects is modeled as a first global circuit node having current and voltage parameters that reflect the aggregate current and voltage parameters of the first group of interconnects. The first global circuit node is used to create an equivalent circuit of the first group of interconnects. In other embodiments, individual parasitic couplings among interconnects in the first group of interconnects also is modeled as a plurality of local circuit nodes. The first global circuit node and the plurality of local circuit nodes then are used to create an equivalent circuit of the first group of interconnects. In identifying the second group of interconnects in the microelectronic device, a second group of interconnects that is spaced apart from the first group of interconnects by more than the first group size, may be identified.

According to other embodiments of the present invention, modeling of the aggregate parasitic couplings of the first group of interconnects to the second group of interconnects may be performed by deriving an aggregate voltage that is generated by the first group of interconnects, deriving an aggregate current that is generated by the first group of interconnects, and modeling the voltage of the first global circuit node by a controlled voltage source having the aggregate voltage or modeling the current of the first global circuit node by a controlled current source having the aggregate current. Moreover, according to other embodiments, an aggregate voltage is derived by accumulating node potentials that result from capacitive coupling of the first group of interconnects to the second group of interconnects, and distributing the branch magnetic fluxes that result from inductive coupling of the first group of interconnects. An aggregate current is derived by distributing node currents that result from capacitive coupling of the first group of interconnects to the second group of interconnects and accumulating branch currents that result in inductive coupling of the first group of interconnects to the second group of interconnects. Moreover, according to still other embodiments, the first global circuit node is used to create an equivalent circuit of the second group of interconnects by extracting a hierarchically sparse representation of couplings among the first group of interconnects, and adding couplings between the first global circuit node to the hierarchically sparse representation of couplings among a first group of interconnects.

Finally, according to other embodiments, hierarchical equivalent circuit models may be created for interconnects by identifying a third group of interconnects in the microelectronic device that is remote from the first and second groups of interconnects. Aggregate parasitic coupling of the first and second group of interconnects to the third group of interconnects is modeled as a third global circuit node that is based on the first and second global circuit nodes. The third global circuit node then is used to create an equivalent circuit of the third group of interconnects.

It will be understood that embodiments of the present invention may be provided as systems, methods and/or computer program products.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. The operations of the present invention, as described more fully hereinbelow, may be performed by an entirely hardware embodiment, an entirely software embodiment or an embodiment combining software and hardware aspects. Furthermore, the present invention may take the form of a computer program product on a computer-readable storage medium having computer-readable program code embodied in the medium. Any suitable computer-readable medium may be utilized including hard disks, CD-ROMs and/or other optical or magnetic storage devices and wired and/or wireless transmission media. Like numbers refer to like elements throughout.

General Description of Hierarchical Equivalent Circuit Modeling

Figure 1:
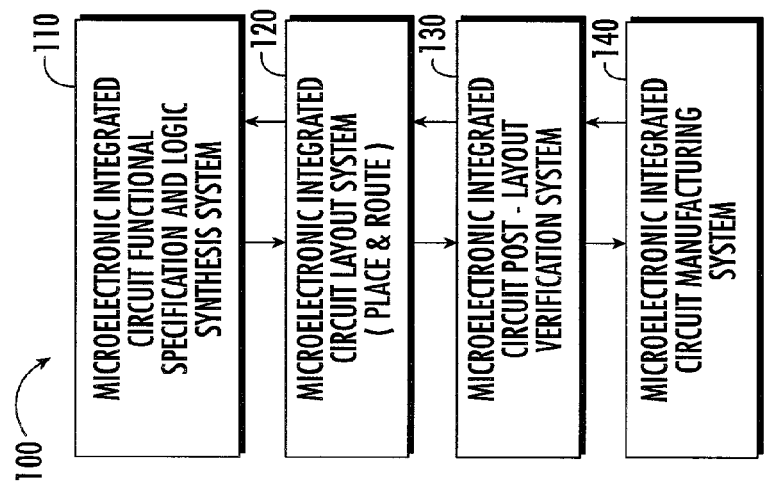
FIG. 1 is a block diagram of microelectronic integrated circuit synthesis, layout, verification and manufacturing tools according to embodiments of the present invention.

Referring now to FIG. 1, operations performed by computer aided microelectronic integrated circuit synthesis, layout, verification and manufacturing systems 100 according to embodiments of the invention will be generally described. These embodiments may include four general subsystems: an integrated circuit functional specification and logic synthesis system 110, an integrated circuit layout system 120, a post-layout verification system 130 and an integrated circuit manufacturing system 140. The microelectronic integrated circuit functional specification and logic synthesis system 110 may include circuit libraries or macros for such elements as logic gates, flip-flops, registers, memory elements, drivers and buffers, for example. The functional specification and logic synthesis system 110 typically provides a vehicle for generating and displaying an electrical schematic of an integrated circuit and producing a computer readable representation of the schematic as a design netlist. The microelectronic integrated circuit layout system 120 typically provides a vehicle for generating a physical layout by placing and routing an electrical circuit schematic generated by the functional specification and logic synthesis system 110. A wiring program may also be provided with the layout system 120 for automatically determining the placement of the wiring interconnect nets between components within the microelectronic integrated circuit.

A verification system 130 is also preferably provided for performing an independent verification of the physical layout to ensure compliance with the requirements of the functional specification and logic synthesis system 110 as well as the manufacturing system 140. Accordingly, the verification system 130 is typically referred to as a "post-layout" verification system and is typically employed near the end of the design process. In addition to acting as an independent verification of the operability and correctness of the layout of the circuit design, the verification system 130 may provide means by which changes and optimizations can be performed. As will be understood by those skilled in the art, various other types of analyses such as timing analysis and circuit/logic simulation may be performed to check whether the specifications and requirements of the first two subsystems 110 and 120 are satisfied. After verification, the physical layout is forwarded to the manufacturing system 140 to produce the microelectronic device such as the integrated circuit. The microelectronic circuit manufacturing system 140 may generate the desired masks, and may control the manufacturing tools to fabricate the integrated circuit on a semiconductor wafer, for example.

It will be understood by those having skill in the art that the integrated circuit functional specification and logic synthesis system 110, microelectronic circuit layout system 120 and various parts of the microelectronic integrated circuit manufacturing system 140 may be realized in whole or in part as software modules running on a computer system. Alternatively, a dedicated stand-alone system with application specific integrated circuits for performing the above described functions may be provided. The general design and operation of the functional specification and logic synthesis system 110, layout system 120 and manufacturing system 140 are well known to those having a skill in the art and need not be described further herein.

Figure 2:
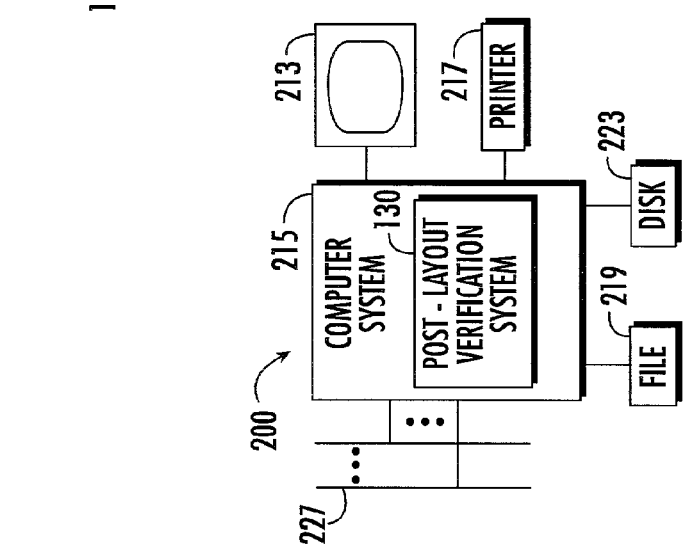
FIG. 2 is a hardware block diagram of post layout verification tools according to embodiments of the present invention.

Referring now to FIG. 2, a general hardware description of a computer workstation containing, among other things, an integrated circuit post-layout verification system, such as the integrated circuit post layout verification system 130 of FIG. 1, will be described. As shown by FIG. 2, the workstation 200 preferably includes a computer 215 containing a post-layout verification software system 130 running thereon. The post-layout verification system 130 may accept a computer representation of the electrical schematic and layout of an integrated circuit via a file 219, disk input 223 and/or data bus 227. A display 213 and a printer 217 are also preferably provided to assist in verifying the layout and design of the integrated circuit. The hardware design of the above described components 213, 217, 219, 227 and 223 is well known to those having skill in the art and need not be described further herein. As one example, the post-layout verification system 130 may be installed on a computer system such as an UltraSPARC 5 workstation marketed by Sun Microsystems Computer Corporation.

Figure 3:
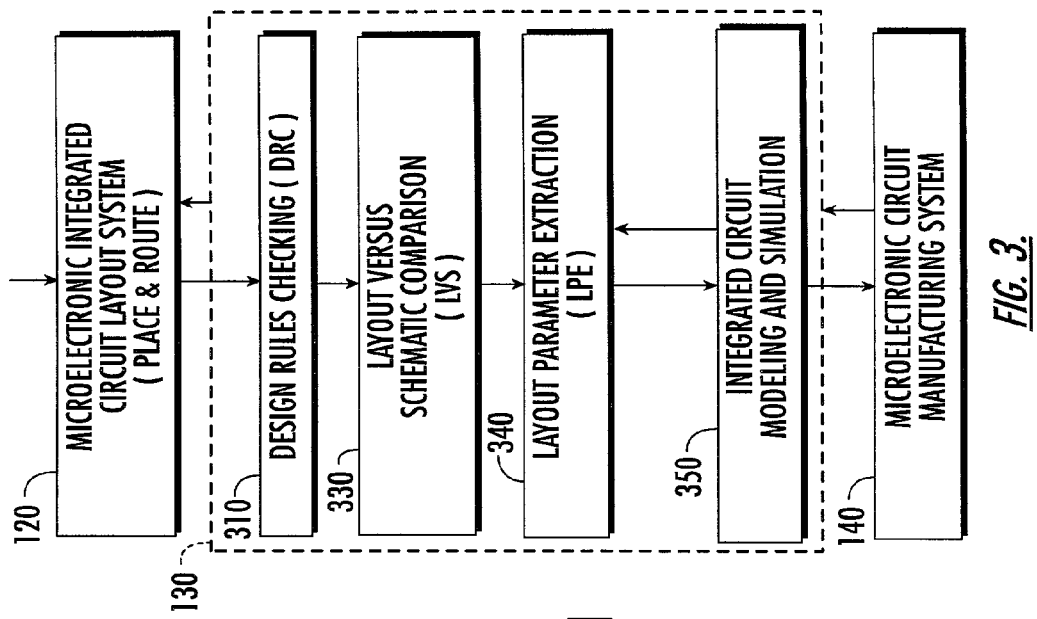
FIG. 3 is a flowchart illustrating general operations performed by post layout verification tools, methods and computer program products according to embodiments of the present invention.

Referring now to FIG. 3, there is illustrated a general overview of operations that can be performed by embodiments of post-layout verification systems, such as post layout verification systems 130 of FIGS. 1 and 2, according to embodiments of the present invention. In particular, embodiments of post-layout verification systems 130 perform a plurality of operations 310, 330, 340 and 350. For the sake of clarity, these operations are illustrated and described as discrete operations. However, in practice many of these operations may be combined and performed in parallel and/or in a different order than illustrated. Additional operations may also be performed by the post-layout verification system 130.

The first operation 310 is performed by a design rule checking (DRC) tool which runs comprehensive design rule checks on a geometric database containing the physical layout of an integrated circuit to be verified. The operations performed by the design rule checking tool can include, among other things, checking for area, grid, length, size, spacing, corner, enclosure, intersection and overlap errors, for example. The second operation 330 can be performed by a hierarchical layout versus schematic (LVS) tool which extracts a hierarchical netlist from the geometric layout database and compares it to the electrical schematic netlist. Layout and schematic logic agreement is then verified at hierarchical matching points, for example.

The third operation 340 is performed by a Layout Parameter Extraction (LPE) tool, also referred to as an extraction tool. This tool may, among other things, perform an initial operation of modeling each of a plurality of interconnect nets within the integrated circuit layout in order to obtain estimates of the parasitic resistance and capacitance of the nets. Once this layout parameter extraction operation 340 is complete, modeling and simulation operations 350 are performed, to obtain an RLC equivalent circuit of the plurality of electric and/or electronic components. The results obtained from these modeling and simulation operations may also be passed back to the layout parameter extraction tool 340. As illustrated by the reverse upward sequence of arrows in FIGS. 1 and 3, the performance of post-layout verification may make it necessary or desirable to redesign the integrated circuit by the functional specification and logic synthesis system 110 and/or modify the physical layout using the layout system 120. Finally, when the integrated circuit is verified for design rule compliance and the layout versus schematic (LVS) comparison and modeling and simulation operations yield acceptable results, the physical layout is forwarded to the manufacturing system 140 to produce the integrated circuit.

Figure 4:
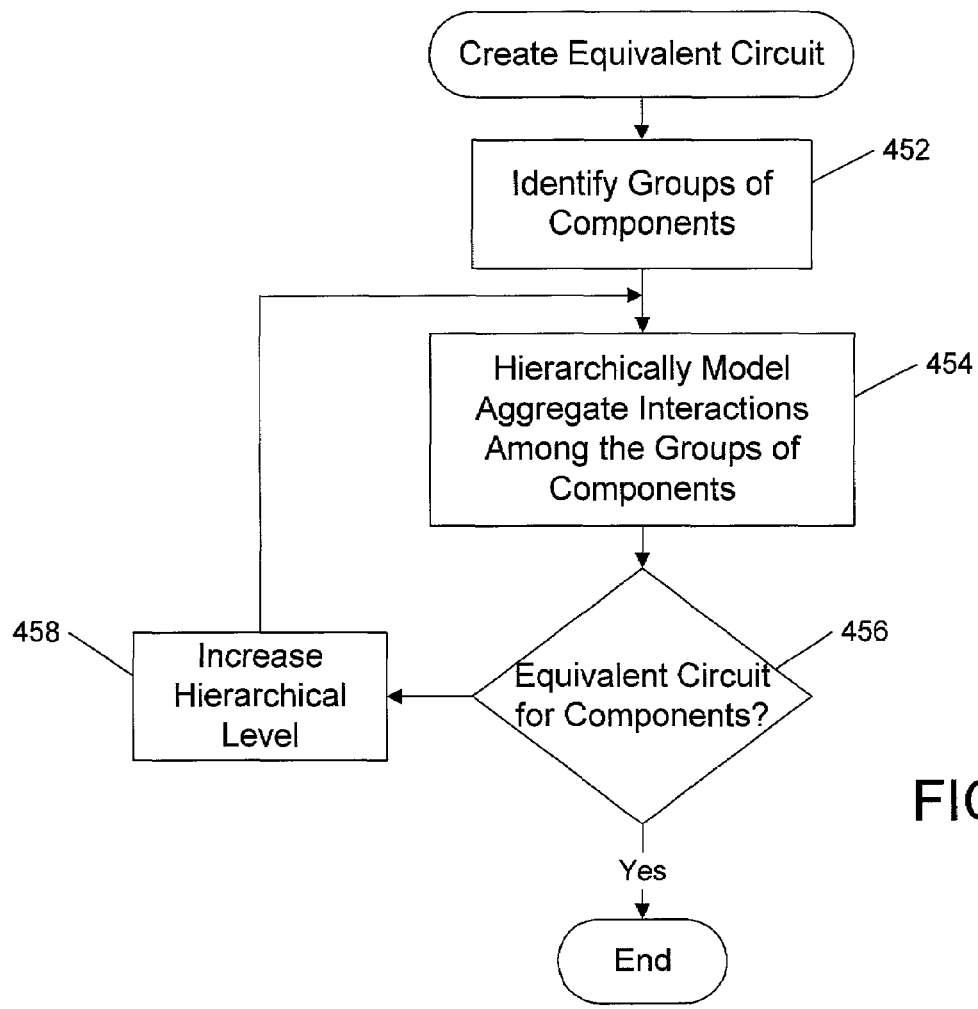
FIGS. 4–5 are flowcharts of operations that can be performed to create equivalent circuits according to embodiments of the present invention.

Referring now to FIG. 4, systems, methods and/or computer program products for modeling and simulation, according to embodiments of the invention, are illustrated. These embodiments of modeling and simulation may correspond to Block 350 of FIG. 3. Referring now to FIG. 4, as shown at Block 452, groups of components are identified from a plurality of electric and/or electronic components. Then, at Block 454, the aggregate interactions among the groups of components is hierarchically modeled. If this hierarchical model provides an equivalent circuit for the component at Block 456, then operations end. If not, then at Block 458, an increase to the next hierarchical level is made, and hierarchical modeling at Block 454 continues until the equivalent circuit for the plurality of components is produced.

Figure 5:
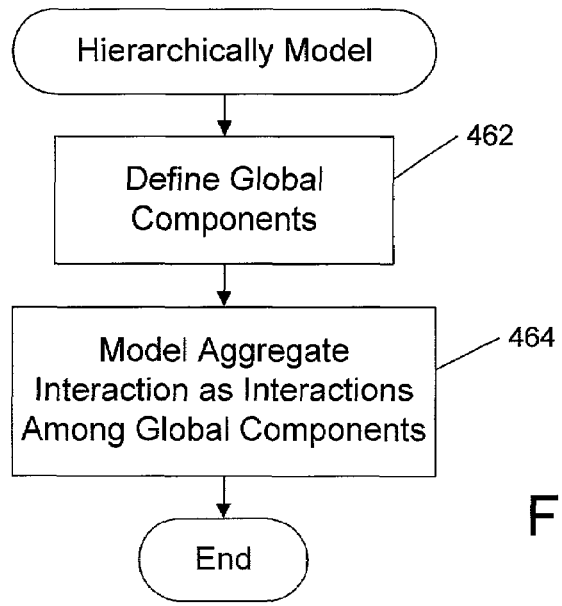

Referring now to FIG. 5, systems, methods and/or computer program products for hierarchical modeling according to embodiments of the invention are shown. These embodiments may correspond to Block 454 of FIG. 4. As shown in FIG. 5, hierarchical modeling may take place by defining a plurality of global components that reflect aggregate parameters of the groups of components. Then, at Block 464, aggregate interaction among the groups of components is modeled as a plurality of interactions among the plurality of global components.

Figure 6A:
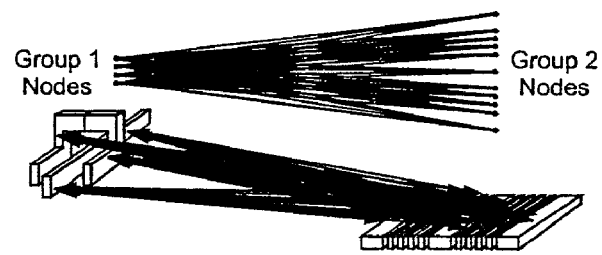
FIG. 6A conceptually illustrates conventional modeling of the coupling between two parts of a circuit by including all individual couplings.
Figure 6B:
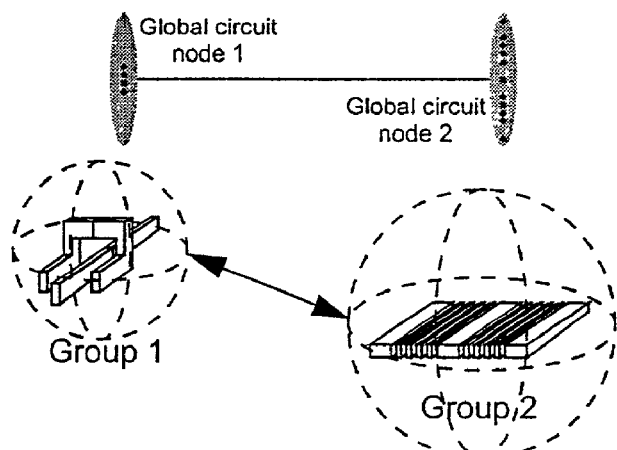
FIG. 6B conceptually illustrates modeling of coupling between two parts of a circuit using global circuit nodes according to embodiments of the present invention.

An example of defining global components (Block 462) and modeling aggregate interactions as interactions among global components (Block 464) now will be described in the context of hierarchical RLC circuit models that capture parasitic-interconnect interactions. According to embodiments of the present invention, the concept of a global circuit node (gcn) is introduced. Instead of modeling the coupling between two parts of a circuit by including all individual couplings as conceptually illustrated in FIG. 6A, two global circuit nodes are introduced that can model the entire coupling by a single value, as shown conceptually in FIG. 6B. Short range (local) couplings still may be modeled individually, but are not included in FIG. 6B for clarity. Thus, in FIG. 6A, every local coupling is included to model the entire interaction. In contrast, in FIG. 6B, significant mutual coupling is stored as one single global coupling. Local couplings within each region still may be included, but are not shown in FIGS. 6A and 6B for clarity.

The global circuit node variables can represent averaged source and potential values over an entire group of conductors and can manifest themselves in the equivalent hierarchical circuit implementation in terms currents and voltages for the additional nodes. The interaction between global and local nodes is modeled via controlled sources which accumulate node voltages and filament currents for larger groups within an RLC network and redistribute the resulting higher-level currents and voltage down to the lower levels of the hierarchy. A piecewise-constant expansion may be used to provide the averaging function for this interaction.

This modeling approach may be regarded as a circuit equivalent to the accumulation and distribution processes that may be used in fast potential evaluation methods employed in parasitic extractors. The sparse RLC circuit models are generated directly from the hierarchical extraction results, such as described in Nabors et al., *FastCap: A Multipole Accelerated 3-D Capacitance Extraction Program*, IEEE Trans. CAD, Vol. 10, No. 11, November 1991, pp. 1447–1459, or Kamon et al., *FastHenry: A Multipole Accelerated 3-D Inductance Extraction Program*, IEEE Trans. Microwave Theory and Techniques, Vol. 42, No. 9, September 1994, pp. 1750–1758, rather than creating, and then reducing a large, flattened RLC circuit.

Figure 7:
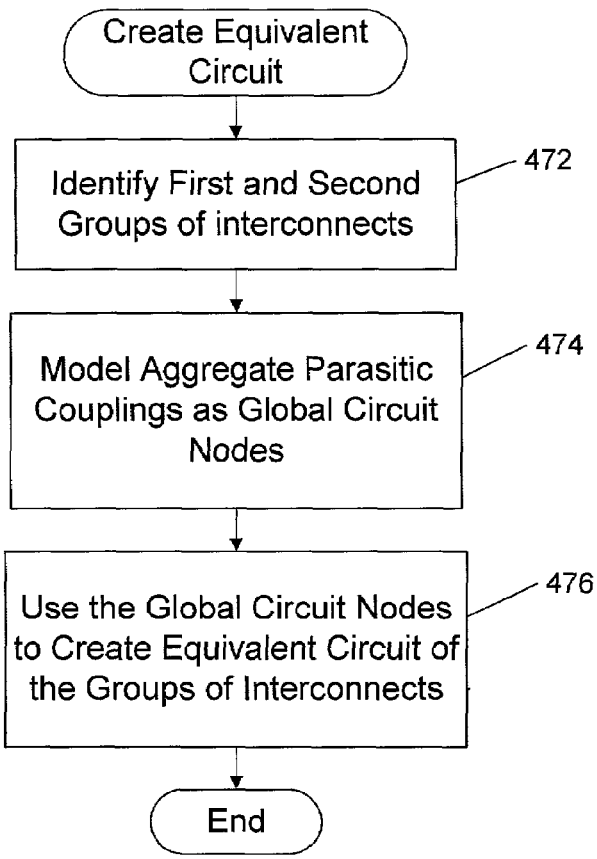
FIGS. 7–12 are flowcharts of other operations that can be performed to create equivalent circuits according to embodiments of the present invention.

More specifically, as shown in FIG. 7, embodiments of the invention can create an equivalent circuit of a plurality of interconnects in a microelectronic device. The creation of an equivalent circuit may be performed as part of integrated circuit modeling and simulation, for example Block 350 of FIG. 3.

As shown in FIG. 7, at Block 472, a first group of interconnects in the microelectronic device is identified, and a second group of interconnects in the microelectronic device that may be, but need not be, remote from the first group of interconnects also is identified, from the plurality of interconnects. At Block 474, the aggregate parasitic coupling of the first group of interconnects to the second group of interconnects is modeled as a coupling between a first global circuit node and a second global circuit node having current and voltage parameters that reflect the aggregate parasitic coupling of the first group of interconnects to the second group of interconnects. Then, at Block 476, the first and second global circuit nodes are used, together with the coupling between them, to create an equivalent circuit of the first and second groups of interconnects.

Figure 8:
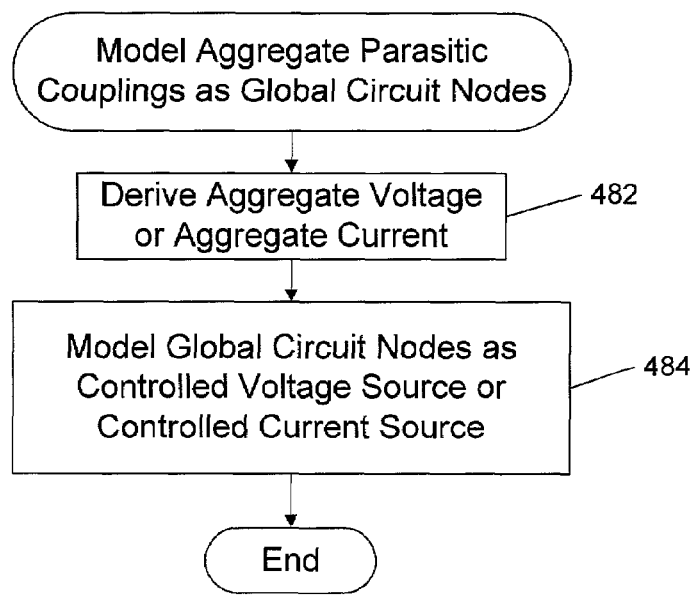

FIG. 8 describes modeling of the aggregate parasitic coupling of the first group of interconnects and the second group of interconnects as first and second global circuit nodes according to embodiments of the invention, which may correspond to Block 474 of FIG. 7. More specifically, as shown in FIG. 8 at Block 482, an aggregate voltage that is generated by a group of interconnects is derived, or an aggregate current that is generated by the group of interconnects is derived. It will be understood that both an aggregate voltage and an aggregate current may be derived. Finally, at Block 484, the global circuit node is modeled as a controlled voltage source having the aggregate voltage, or a controlled current source having the aggregate current.

Figure 9:
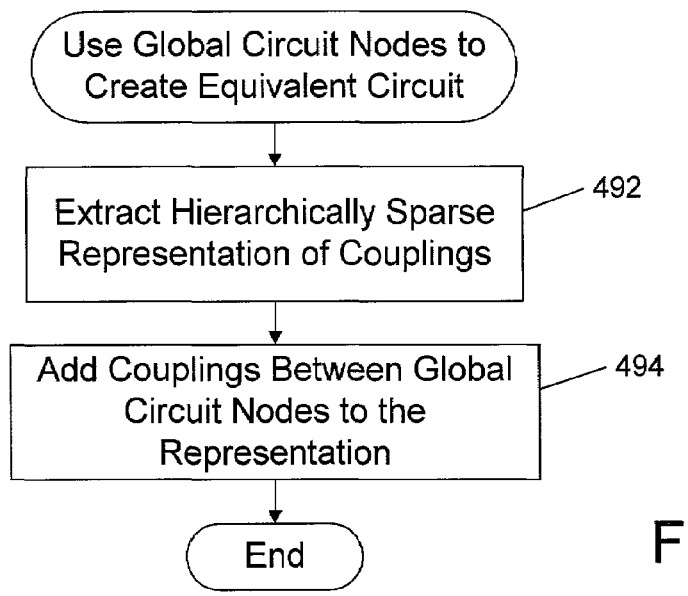

FIG. 9 describes using a global circuit node to create an equivalent circuit of a group of interconnects, which may correspond to Block 476 of FIG. 7. More specifically, as shown in FIG. 9 at Block 492, a hierarchically sparse representation of couplings among the groups of interconnects is extracted. Then, at Block 494, the couplings between the global circuit nodes are added to the hierarchically sparse representation of couplings among the groups of interconnects.

Figure 10:
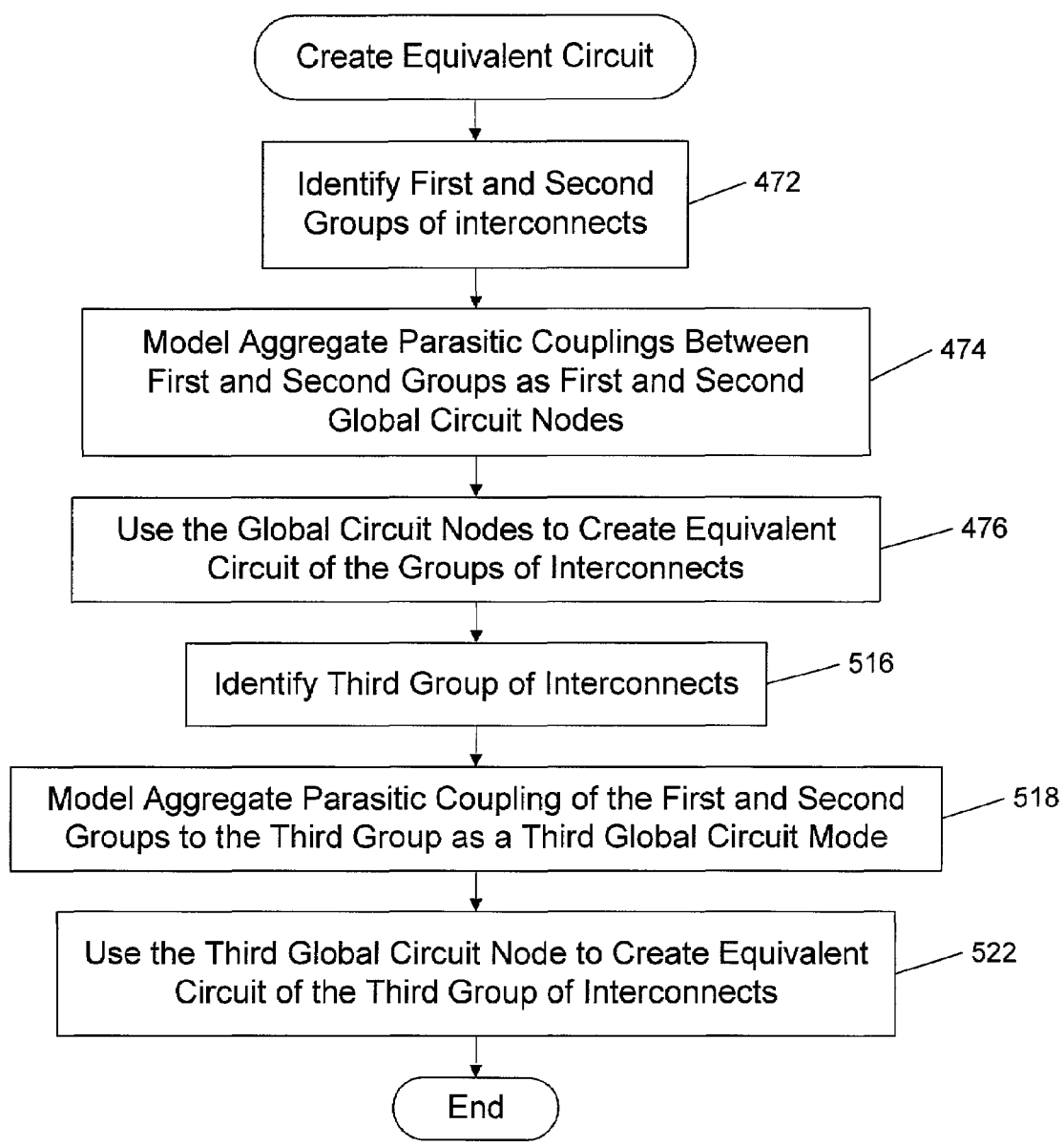

FIG. 10 illustrates operations for creating an equivalent circuit of a plurality of interconnects in a microelectronic device according to other embodiments of the invention. These operations may be performed as part of integrated circuit modeling and simulation, for example Block 350 of FIG. 3. As shown in FIG. 10, operations corresponding to Blocks 472, 474 and 476 of FIG. 7 may be performed. Then, at Block 516, a third group of interconnects is identified that may be, but need not be, remote from the first and second groups of interconnects. At Block 518, aggregate parasitic coupling of the first and second group of interconnects to the third group of interconnects is modeled as couplings between third global circuit node and the first and second global circuit nodes. Finally, at Block 522, the third global circuit node is used to create an equivalent circuit of the third group of interconnects. Accordingly, hierarchical equivalent circuit models of interconnects may be created.

Figure 11:
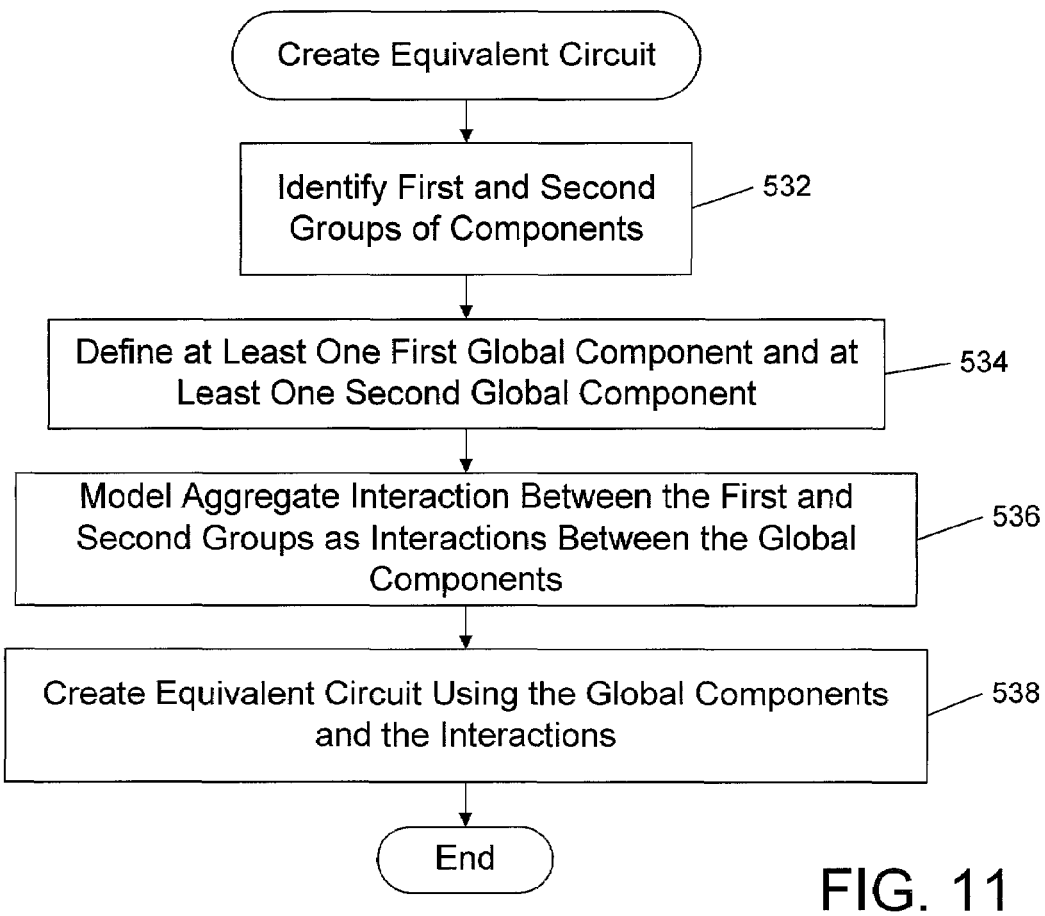

As was described above, embodiments of the present invention also may be used to create an equivalent circuit from a plurality of electric (passive) and/or electronic (active) circuit components. FIG. 11 illustrates embodiments of the invention that create an equivalent circuit from a plurality of electric and/or electronic circuit components. As shown at Block 532, a first group of components is identified, and a second group of components that may be, but need not be, remote from the first group of components also is identified from the plurality of electric and/or electronic components. At Block 534, at least one first global component and at least one second global component is identified, that have global component parameters that reflect aggregate parameters of the first group of components and the second group of components, respectively. At Block 536, aggregate interaction among the first group of components and the second group of components is modeled as a plurality of interactions between the at least one first global component and the at least one second global component. Finally, at Block 538, an equivalent circuit of the plurality of components is created, using the first and second groups of components, the at least one first global component, the at least one second global component and the interactions between the at least one first global component and the at least one second global component that are modeled.

Figure 12:
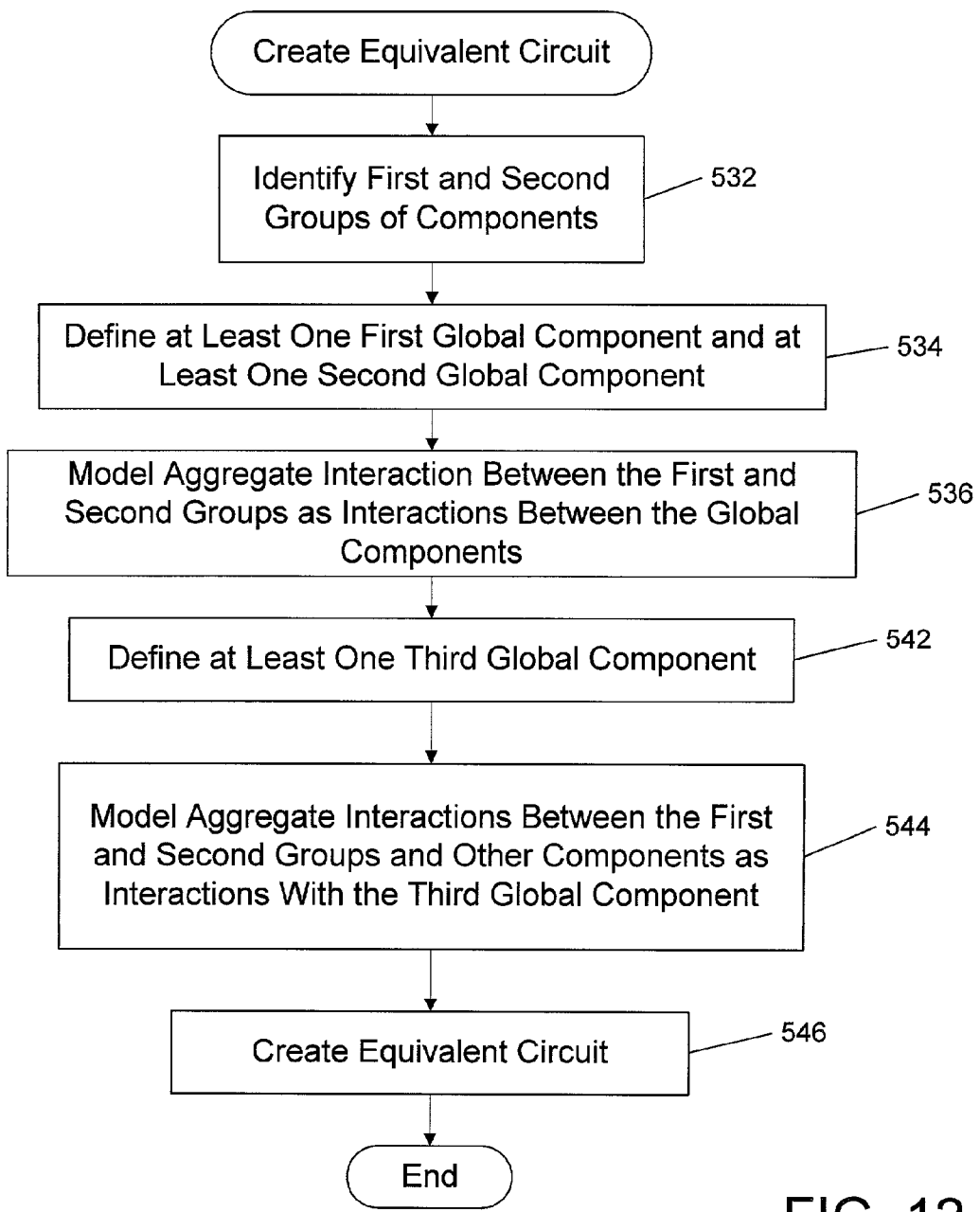

FIG. 12 is a flowchart illustrating other operations for creating equivalent circuits according to embodiments of the invention, which may correspond to Block 350 of FIG. 3. As shown in FIG. 12, operations for identifying first and second groups of components, defining at least one first global component and at least one second global component and modeling aggregate interaction, corresponding to Blocks 532, 534 and 536 of FIG. 11, are first performed. Then, at Block 542, at least one third global component is defined that has global component parameters that reflect aggregate parameters of the first and second groups of components and the at least one first and second global components. At Block 544, aggregate interaction among the first and second groups of components and others of the plurality of components is modeled as a plurality of interactions between the at least one third global component and the others of the plurality of components. Then, at Block 546, the equivalent circuit is created of the plurality of components using the at least one third global component. Accordingly, hierarchical RLC equivalent circuits may be created from the parameters that are extracted.

In all of the above-described embodiments, individual interactions among components in the groups of components also may be modeled as a plurality of local circuit nodes, and the local circuit nodes also may be used in creating the equivalent circuit. Thus, for example, individual parasitic couplings among interconnects in a group of interconnects may be modeled as a plurality of local circuit nodes. The equivalent circuit then may be created using the global circuit nodes and the local circuit nodes. Moreover, in all of the above embodiments, the first and second groups of components or interconnects may be identified by identifying a first group of components having a first group size and identifying a second group of components having a second group size that is spaced apart from the group of components by more than a smaller first group size and the second group size. For example, when defining first and second groups of interconnects, the first group of interconnects may be identified, having a first group width, and the second group of interconnects that is spaced apart from the first group of interconnects by more than a first group width may be identified.

Embodiments of the present invention may stem from realizations that present-day parasitic extractors can represent far and near field couplings hierarchically, which can reduce the memory and runtime requirements for the potential matrix evaluation to order $O(N)$, with N being the number of units (panels, filaments) into which the interconnect has been subdivided for a boundary element method (BEM) solution. See, for example, Brebbia, *Boundary Element Techniques in Computer Aided Engineering*, NATO ASI on BEM in CAD, 1983. The hierarchical approach can exploit the fact that the potential of a point charge or a localized current distribution decays with at least $1/r$ with increasing distance r from the source (charge, current). Groups of sources, therefore, appear as point sources (monopoles) at sufficiently large distances.

Thus, it may be unnecessary to model couplings between each unit pair separately if the desired potential evaluation (and thus extraction) accuracy is limited. Couplings only may need to be modeled if the size of the two units is comparable to the minimal distance between them. Far range couplings may only be represented as couplings between pairs of groups of units whose group size is comparable to the minimal distance between the groups.

Since the average number of neighbors (directly coupled groups) of each unit and group may only be dependent on the desired accuracy, which is assumed to be given and fixed, such as described in Shi et al., *A Fast Hierarchical Algorithm for 3-D Capacitance Extraction*, Proc. 35$^{th}$ Design Automation Conference (DAC), June 1998, the total number of couplings for the entire interconnect system can be of the order $O(N)$. If the number of nodes in the hierarchical tree is fixed and the accuracy is increased, the number of couplings generally will increase, due to more couplings at lower levels.

Unfortunately, this efficient hierarchical representation of interconnect parasitics is not generally exploited to create sparse parasitics netlists for subsequent simulation or timing analysis. Rather, an extraction tool typically produces a netlist with coupling capacitances and inductances between only the smallest units of the interconnect circuit representation: the nodes and branch self-inductances. To cope with the resulting huge RLC circuits in timing analysis, model order reduction methods have been developed to represent the linear interconnect by equivalent circuits modeling only its dominant dynamic features. But even these reduction methods may not cope with the full $O(N^2)$ couplings that the extractor would normally generate.

Figure 13:
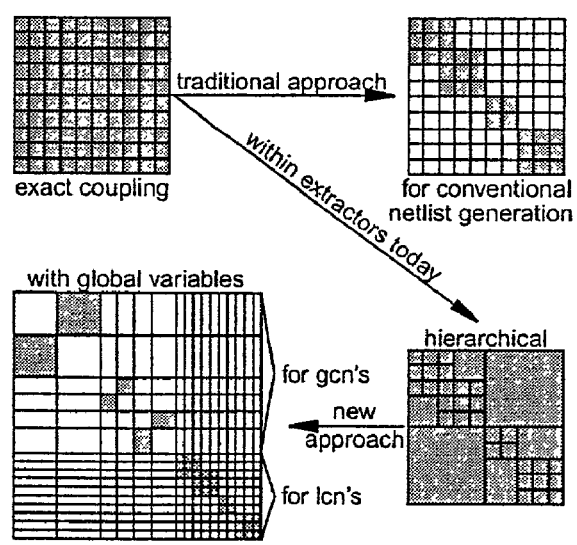
FIG. 13 is a conceptual diagram that contrasts conventional sparsity with hierarchical sparsity according to embodiments of the present invention.

A conventional approach to interconnect matrix sparsification has been to remove long range couplings by simply truncating them or mapping them to the near field couplings to preserve stability. This may make model order reduction feasible and may be appropriate as long as the faraway couplings are actually negligible. Removal of long range couplings can make extraction more efficient, since an entire chip can be broken down into a set of small interconnect patterns which are precomputed and stored in a database. Simulation can become more efficient since the coupling matrices (capacitance, inductance) of the circuit contain mainly zeroes and are, therefore, conventionally sparse. See the top portion of FIG. 13, which conceptually illustrates a conventional approach for netlist generation. In FIG. 13, each small square symbolizes one number, with the gray fields being non-zeros.

However, increasing density of integrated circuit interconnect and the high performance component-based design styles may render the electromagnetic influence between different parts of a chip significant even when the individual wire-to-wire couplings may be negligible. To address this problem embodiments of the invention can exploit the hierarchical sparsity, which can manifest itself in a different way than conventional sparsity, as shown in the bottom portion of FIG. 13.

Detailed Description of Hierarchical Equivalent Circuit Modeling

A detailed description of hierarchical equivalent circuit modeling according to embodiments of the present invention now will be provided. Since simulators today may take direct advantage of conventional sparsity, the hierarchically sparse parasitics representation within the extractor is converted into a conventionally sparse structure via the introduction of global circuit nodes (gcn), according to embodiments of the invention. These global circuit nodes, which represent groups of conductors, can augment the currently used local circuit nodes (lcn) which describe single conductors, as was illustrated conceptually in FIGS. 6A and 6B.

A methodology has been developed to translate the hierarchically sparse representation within an extractor into a hierarchical equivalent circuit that can be simulated by a variation of modified nodal analysis. Voltage controlled voltage sources and current controlled current sources are used to redistribute the accumulated node voltages and filament currents for larger groups within an RLC circuit from the higher-level (global) currents and charges down to the lower levels of the hierarchy. This may be viewed as a circuit analogy to the accumulation and distribution processes seen in the fast potential evaluation methods employed in parasitic extractors.

The derivation of capacitance and inductance parameters for global circuit nodes according to embodiments of the invention now will be described in detail.

A. Capacitance a) Accumulation of Node Potentials

Figure 14:
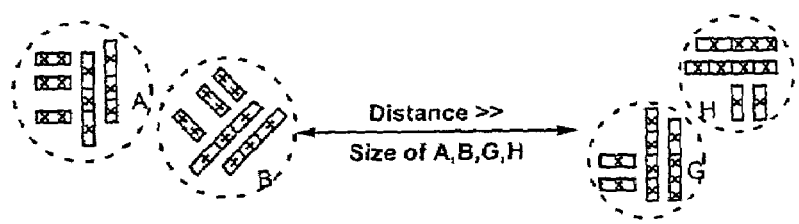
FIG. 14 conceptually illustrates groups of interconnects that may be modeled to accumulate node potentials according to embodiments of the present invention.

Referring to FIG. 14, A and B are the aggressor groups and G and H are the victim groups. Let $V_{Ai}$ be the potential of the $i^{th}$ node in the aggressor group A. Let $Q_{Gj,A}$ be the charge at the $j^{th}$ node in the victim group G due to the potential of the conductors in A. Similarly for groups B and H. Then, $$Q_{Gj,A} = \Sigma_{i \in A} C_{ji} V_{Ai}, \quad (1)$$

where $C_{ji}$ is the short circuit capacitance between nodes i and j. Current relationships can be found by taking the time derivative of the corresponding charge relations. The total charge induced in G and H by the potential of conductors in A is:

$$Q_{GH,A} = \sum_{i \in A} V_{Ai} \sum_{j \in GH} C_{ji}. \quad (2)$$

The total charge on G and H separately is defined similarly. The fraction of charge induced in G from Equation (2) is $Q_{G,A}/Q_{GH,A}$. However, this expression depends on the aggressor node potentials:

$$(Q_{G,A}/Q_{GH,A})_{exact} = \frac{\left(\sum_{i \in A} V_{Ai} \sum_{j \in G} C_{ji}\right)}{\left(\sum_{i \in A} V_{Ai} \sum_{j \in GH} C_{ji}\right)}. \quad (3)$$

Figure 15:
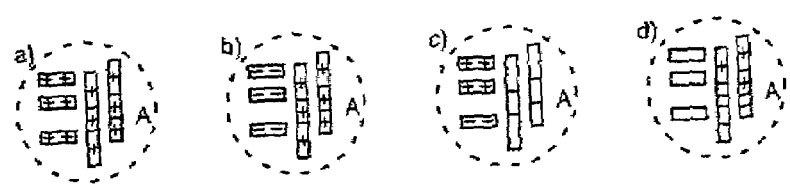
FIG. 15 conceptually illustrates a piecewise-constant expansion of an aggressor group of FIG. 14.

The node potential accumulation rule for the hierarchical equivalent circuit should be linear in the aggressor node voltages to be implemented as a controlled source, so Equation (3) is approximated by an expression independent of the $V_{Ai}$. For this, the $V_{Ai}$ distribution is expanded in terms of a piecewise-constant expansion, up to second order as shown in FIG. 15, where a corresponds to order 0, b corresponds to order 1, c corresponds to order 2 and d corresponds to order 2. Note the potential signs in FIG. 15. Using only the zeroth order (average) term for the $V_{Ai}$ (all $V_{Ai}$ equal to the average), the approximation $$(Q_{G,A}/Q_{GH,A})_{est} = \left(\sum_{i \in A} \sum_{j \in G} C_{ji}\right) / \left(\sum_{i \in A} \sum_{j \in GH} C_{ji}\right) \quad (4)$$

is found.

The accuracy of this approximation can be increased by increasing the minimal distance between conductor groups to which this coupling approximation is applied, i.e. increasing the window size. Weighting the total charge induced by A with the factor in Equation (4) yields an approximation for $Q_{G,A}$ which depends linearly on the composite potential of A:

$$(Q_{G,A})_{est} = \left[\left(\sum_{i \in A} V_{Ai} \sum_{j \in GH} C_{ji}\right) \bigg/ \left(\sum_{i \in A} \sum_{j \in GH} C_{ji}\right)\right] \cdot \left(\sum_{i \in A} \sum_{j \in G} C_{ji}\right). \quad (5)$$

The first factor in Equation (5) represents the accumulated node potentials of A which preserves the charge induced from A into each of its victim groups with a high level of accuracy:

$$V_A^{est} = \left(\sum_{i \in A} V_{Ai} \sum_{j \in GH} C_{ji}\right) \bigg/ \left(\sum_{i \in A} \sum_{j \in GH} C_{ji}\right). \quad (6)$$

When using a hierarchical extractor to find the couplings, the individual $C_{ij}$ will not be available. Rather, the individual couplings may be approximated on a per instance basis by local extraction. The second factor in Equation (5) is the composite coupling from A to G. This composite coupling is regularly generated within hierarchical extractors in use today, as described, for example, in the above-cited Nabors et al. publication, so extra effort may not be necessary to obtain this value.

b) Distribution of Node Charge (Current)

The higher level charge for the victim nodes can be redistributed onto the child nodes using controlled sources in the hierarchical equivalent circuit model. For maximum accuracy, the higher level charge may be distributed as close as possible to the exact distribution. In the exact case, the fraction of charge on node $G_j$ is:

$$(Q_{Gj,AB}/Q_{G,AB})_{exact} = \left(\sum_{i \in A} C_{ji} V_{Ai} + \sum_{i \in B} C_{ji} V_{Bi}\right) \bigg/ \left(\sum_{j \in G} \left(\sum_{i \in A} C_{ji} V_{Ai} + \sum_{i \in B} C_{ji} V_{Bi}\right)\right). \quad (7)$$

Applying again the zeroth order average of the expansion for the aggressor potential distribution shown in FIG. 15, but now for all aggressors combined:

$$(Q_{Gj,AB}/Q_{G,AB})_{est} = \left(\sum_{i \in AB} C_{ji}\right) \bigg/ \left(\sum_{j \in G} \sum_{i \in AB} C_{ji}\right). \quad (8)$$

This ratio can be used to find the approximate amount of charge induced on Vj by all aggressors in A and B:

$$(Q_{Gj,AB})_{est}^h = (Q_{G,AB})^h \cdot \left(\sum_{i \in AB} C_{ji}\right) \bigg/ \left(\sum_{j \in G} \sum_{i \in AB} C_{ji}\right). \quad (9)$$

B. Inductance a) Accumulation of Branch Currents

Figure 16:
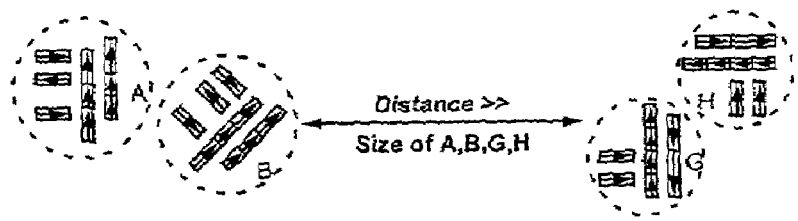
FIG. 16 conceptually illustrates groups of interconnects that may be used to model inductance according to embodiments of the present invention.

Cartesian coordinates are used in the following and bold characters denote xyz-vectors. For the example in FIG. 16 let $I_{Ai}$ be the current in the $i^{th}$ segment in the aggressor group A. Let $\Phi_{Gj,A}$ be the magnetic flux through the ∞-loops in x-, y- and z-direction of the $j^{th}$ segment in the victim group G due to the currents of the segments in A. Perpendicular loops to infinity are used in defining partial inductance. Similarly for B and H. Then:

$$\Phi_{Gj,A} = \Sigma_{i \in A} L_{ji} * I_{Ai}, \quad (10)$$

where "*" denotes an element-by-element multiplication. Each $L_{ji}$ is an xyz-vector specifying the partial inductive coupling in the x, y and z-directions. In the following, branch voltage relations can be found by taking the time derivative of the corresponding flux relations. The total flux induced through the ∞-loops of G and H by the current in conductors in A is:

$$\Phi_{GH,A} = \sum_{i \in A} \left[\bigcup_{j \in GH} L_{ji}\right] * I_{Ai}. \quad (11)$$

Total flux through G and H separately is defined similarly.

Figure 17:
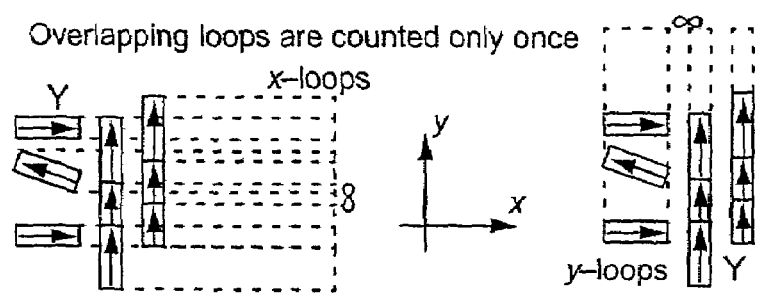
FIG. 17 conceptually illustrates composition of infinite loops and the definition of composite partial inductance according to embodiments of the present invention.

Note that $\bigcup_{j \in Y} L_{ji}$ is defined as the composite partial inductance between an aggressor segment i and all segments in a victim group Y. See FIG. 17. This is not the sum of all individual partial inductances, but the amount of flux flowing through the composition of the ∞-loops of all segments in Y if unit current is flowing through the aggressor segment i. Overlapping loops are only counted once.

The fraction of flux induced in G from Equation (11) is $\Phi_{G,A} \backslash \Phi_{GH,A}$ where '\' denotes an element-by-element division. However, this expression depends on the aggressor branch currents:

$$(\Phi_{G,A}|\Phi_{GH,A})_{exact} = \frac{\left(\sum_{i \in A} \left[\bigcup_{j \in G} L_{ji}\right] * I_{Ai}\right)}{\left(\sum_{i \in A} \left[\bigcup_{j \in GH} L_{ji}\right] * I_{Ai}\right)}. \quad (12)$$

The branch current accumulation rule for the hierarchical equivalent circuit should be linear to be implemented as a triplet of controlled sources, so Equation (12) may be approximated by an expression independent of the $I_{Ai}$. For this, the $I_{Ai}$ is expanded in terms of a piecewise-constant expansion, up to second order shown in FIG. 18. Using only the zeroth order (average) term for the $I_{Ai}$ (all $I_{Ai}$ equal to unit in their current directions) the following approximation is found:

$$(\Phi_{G,A}|\Phi_{GH,A})_{est} = \left(\sum_{i \in A} \bigcup_{j \in G} L_{ji}\right) \bigg\backslash \left(\sum_{i \in A} \bigcup_{j \in GH} L_{ji}\right). \quad (13)$$

The accuracy of this approximation can be increased by increasing the minimal distance between conductor groups to which this coupling approximation is applied, i.e. increasing the window size. Weighting the total flux induced by A with the factor in Equation (13) yields an approximation for $\Phi_{G,A}$ which depends linearly on the composite branch currents of A:

$$(\Phi_{G,A})_{est} = \left[\sum_{i \in A} \bigcup_{j \in G} L_{ji}\right] \cdot \quad (14)$$

$$\left[\left(\sum_{i \in A}\left(\left[\bigcup_{j \in GH} L_{ji}\right] * I_{Ai}\right)\right) \setminus \left(\sum_{i \in A} \bigcup_{j \in GH} L_{ji}\right)\right].$$

The second factor in Equation (14) represents the averaged branch currents of A in all three directions which preserves the magnetic flux induced from A into each of its victim groups with a high level of accuracy:

$$I_A^{est} = \left[\left(\sum_{i \in A}\left(\left[\bigcup_{j \in GH} L_{ji}\right] * I_{Ai}\right)\right) \setminus \left(\sum_{i \in A} \bigcup_{j \in GH} L_{ji}\right)\right]. \quad (15)$$

The first factor in Equation (14) is the composite inductive coupling from A to G. This composite coupling may be generated within hierarchical extractors in use today as described in the above-cited Kamon et al. publication, so extra effort may not be necessary to obtain these values.

b) Distribution of Branch Magnetic Flux (Voltage)

The higher level magnetic flux for the victim groups can be redistributed onto the child segments using controlled sources in the hierarchical equivalent circuit model. For maximum accuracy, the higher level flux may be distributed as close as possible to the exact distribution. In the exact case, the fraction of flux through the ∞-loop of segment $G_j$ is $$(\Phi_{Gj,AB} | \Phi_{G,AB})_{exact} = \left(\sum_{i \in A} L_{ji} * I_{Ai} + \sum_{i \in B} L_{ji} * I_{Bi}\right) \setminus \quad (16)$$

$$\left(\sum_{i \in A}\left[\bigcup_{j \in G} L_{ji}\right] * I_{Ai} + \sum_{i \in B}\left[\bigcup_{j \in G} L_{ji}\right] * I_{Bi}\right).$$

Figure 18:
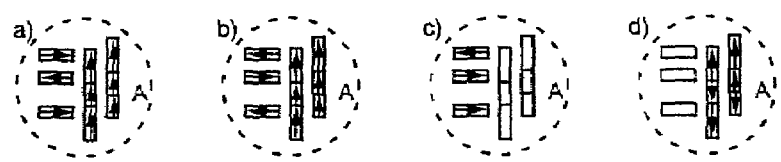
FIG. 18 conceptually illustrates a piecewise-constant expansion of an aggressor group from FIG. 16.

Applying again the zeroth order (average) of the expansion for the aggressor branch current distribution shown in FIG. 18, but now for all aggressors combined:

$$(\Phi_{Gj,AB} | \Phi_{G,AB})_{est} = \left(\sum_{i \in AB} L_{ji}\right) \setminus \left(\sum_{i \in AB}\left[\bigcup_{j \in G} L_{ji}\right]\right). \quad (17)$$

This ratio can be used to find the approximate amount of flux induced through the ∞-loop of $G_j$ by all aggressors in A and B:

$$(\Phi_{Gj,AB})_{est}^h = (\Phi_{G,AB})^h * \left[\left(\sum_{i \in AB} L_{ji}\right) \setminus \left(\sum_{i \in AB}\left[\bigcup_{j \in G} L_{ji}\right]\right)\right]. \quad (18)$$

C. Couplings:

The long-distance couplings, such as those represented by hierarchical or multipole expansions, are modeled by introducing relatively few group-to-group coupling capacitors and inductors between auxiliary higher-level nodes to represent global interactions within the system.

Using, for example, the above-described equivalent model, the long-range couplings can be captured efficiently, while allowing an overwhelming number of minuscule separate L's and C's to be avoided. This may be contrasted to methodologies which discard these terms entirely, even though their aggregate long distant coupling impact can be significant when all of the single components may not be significant. These aggregate couplings may become more important for controlling electromagnetic interactions in high performance component-based designs.

EXAMPLES

The following Examples provide detailed structural and functional descriptions of hierarchical equivalent circuit modeling of interconnects according to embodiments of the invention. These Examples are illustrative and shall not be construed as limiting.

Commercial circuit simulators, such as SPICE, only may allow independent voltage sources as controllers for current controlled sources. SPICE is described, for example, in a publication by Nagel et al., *Computer Analysis of Nonlinear circuits, Excluding Radiation (CANCER)*, IEEE Journal of Solid State Circuits, SC-6, August 1971, pp. 162–182. This arbitrary restriction may need approximately 2N additional nodes for hierarchical equivalent circuit models according to embodiments of the invention, where N is the number of filaments. In addition, SPICE may need mutual inductors between zero-valued self-inductors to model the long range magnetic interaction, since a mutual inductor $M_{12}$ between two self-inductors is specified by its coefficient of induction $M_{12}/\sqrt{L_1 L_2}$. This representation may break down for hierarchical equivalent circuit models according to embodiments of the invention, since the coefficient of induction may be infinite for the global circuit nodes. One may work around these restrictions with elaborate controlled source elements in the SPICE netlist. However, doing so may reduce the performance gains introduced by embodiments of the present invention.

To allow a fair comparison of the original, flat circuit and hierarchical equivalent circuit models according to embodiments of the invention, a prototype simulator has been implemented in Matlab without the restrictions listed above. It handles couplings between zero-valued self-inductors and allows current controlled sources to be controlled by any element which introduces a current variable in the MNA matrix representation. In addition, self-inductors and their associated voltage controlled voltage sources are represented by single composite inductors. All of this is possible since the prior restrictions do not appear to be rooted in the algorithms commonly used for circuit simulation (such as modified nodal analysis, which was used), but appear to be obsolete conventions for simulators which were written for systems with much simpler interconnect circuits when nonlinear devices dominated the circuit behavior.

Large signal buses generally are especially sensitive to on-chip interconnect parasitics while generally being very costly to analyze. Two examples will be used to demonstrate potential efficiency of hierarchical circuit models according to embodiments of the invention. The first is a 32-bit bus with in-plane return lines. The second is five signal lines over a meshed ground plane. These examples also are described in detail in a publication by coinventor Beattie, Satarjit Gupta and coinventor Pileggi, entitled *Hierarchical*

*Interconnect Circuit Models*, ICCAD 2000, the disclosure of which is hereby incorporated herein in its entirety as if set forth fully herein.

A. 32 Bit Bus Example with In-Plane Return Lines

Figure 19:
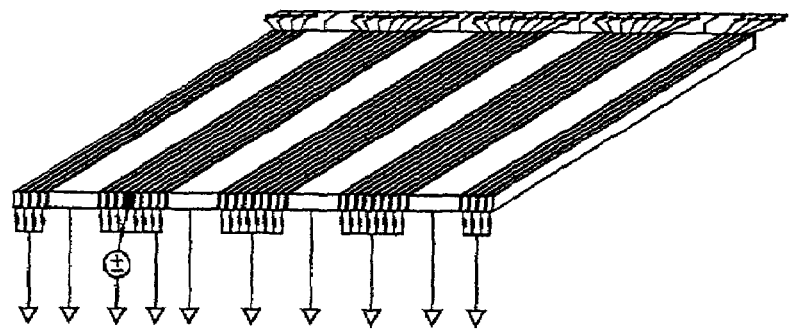
FIG. 19 is a perspective view of a 32 bit bus that can be modeled according to embodiments of the present invention.

FIG. 19 shows a 32 bit bus in which line 8 is active. For all signal lines, driver resistance is 70 Ω, load capacitance is 25 pF, thickness is 2 μm, spacing is 2 μm, length is 1000 μm and width is 2 μm. The width of returns is 7 μm. System size is about 1015 μm. Materials are copper (ρ=17.5nΩμ) and $SiO_2$ ($\epsilon_r$=3.9, $\mu_r$=1.0).

Figure 20:
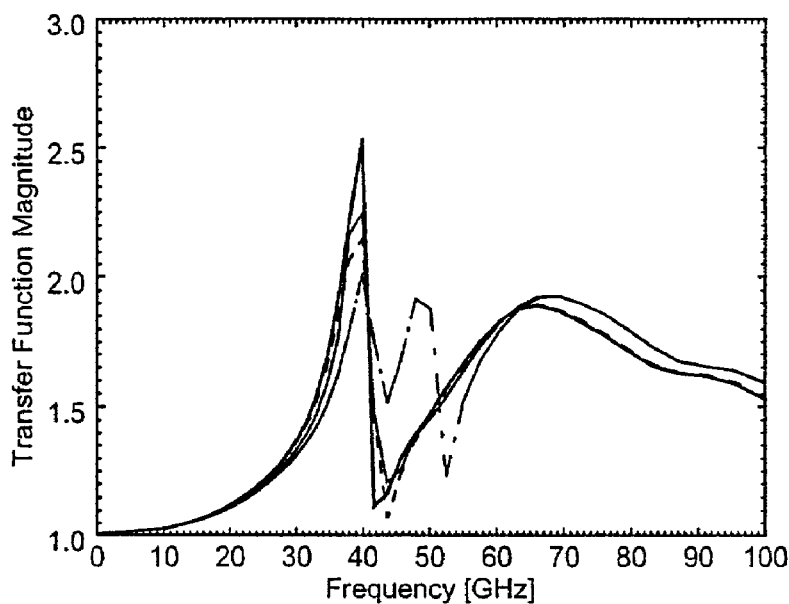
FIG. 20 graphically illustrates a transfer function from a near end to a far end node of an active line in FIG. 19.

In FIG. 20, the voltage responses at the far end of the active line are compared for four cases: The full RLC system (solid bold), hierarchical model for a lowest-level window of 25% system size (72% sparsity) (solid), truncation for same window size (dash-dot), and truncation with comparable accuracy to hierarchical case (dashed). Here the window size is roughly 62% system size (20% sparsity).

Figure 21:
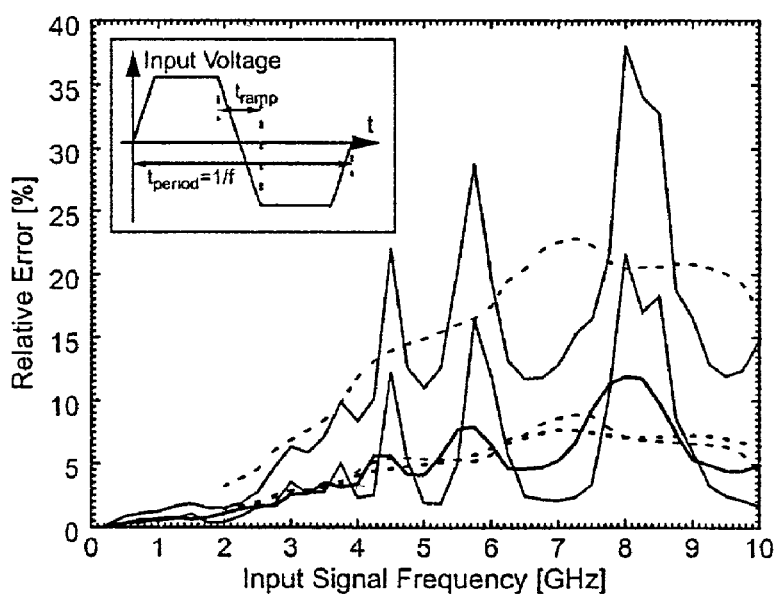
FIG. 21 graphically illustrates active line far end node signal error versus signal frequency for FIG. 19.

The hierarchical accuracy is clearly much better around the resonance peak at about 40 GHz than that for truncate for the same window size. This explains in turn the lower signal error of the hierarchical model in FIG. 21. FIG. 21 graphically illustrates active line far end node signal error versus signal frequency. The signal is a ramp-rectangular wave shown in the upper left ($t_{ramp}=t_{period}/20$). Hierarchical small window (bold), truncate small window (upper thin curve), truncate large window (lower thin curve) are shown. Running averages are shown dotted. Since the Fourier transform of the ramp wave shown in FIG. 21 is a sinc wave, the resonance peak from FIG. 20 is repeated periodically in FIG. 21 every time a peak of the sinc wave passes through the resonance region of the interconnect system. This causes the choppy behavior of all results. However, the variance of the hierarchical signal error is smaller than for truncate-only, showing higher stability of the hierarchical model.

For the same small window size (72% sparse) the hierarchical model has not only a 2–3× higher accuracy than truncation, but also shows the resonance peak at 40 GHz clearly, which the truncation approach only shows when considering 80% of all individual couplings. This shows that composite long-range interactions are not negligible, and should be included for accurate modeling of the interconnect parasitics.

Table 1 illustrates run time and memory comparison for results in FIG. 20. Table 1 shows that for a large window, truncation uses a runtime about 3.5 times that of the hierarchical model, although the error is still higher. For comparable sparsity, runtime and memory consumption of the hierarchical model are moderately larger than for truncation, due to the overhead caused by the global circuit nodes. As a consequence, however, the accuracy is better for the hierarchical approach due to the inclusion of composite long distance interactions.

TABLE 1

|  | Full | Hier. small | Tr. small | Tr. Large |
|---|---|---|---|---|
| Runtime [s] | 16810 | 2932 | 1692 | 10777 |
| Window [μm] | 1015 | 257 | 257 | 621 |
| Capacitance Elements | 63,896 | 17,513 | 17,496 | 50,936 |
| Inductance Elements | 64,980 | 18,381 | 18,324 | 51,660 |
| Sparsity | 0% | 72.1% | 72.2% | 20.4% |

Figure 22:
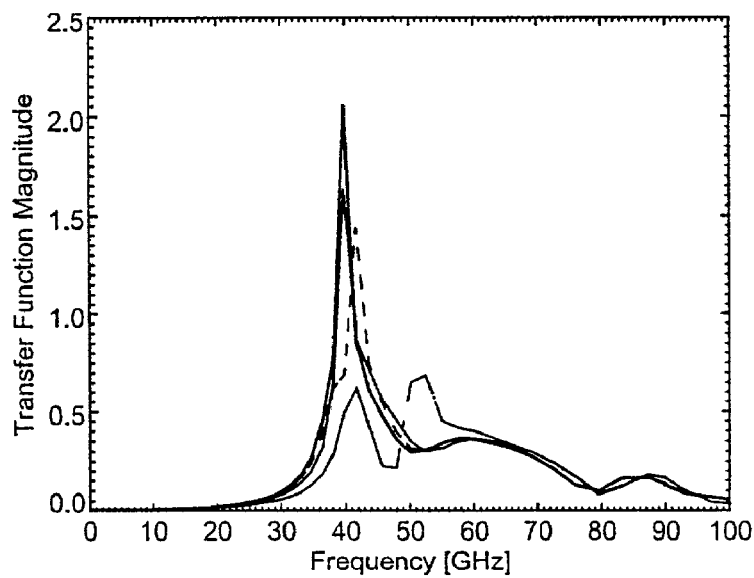
FIG. 22 graphically illustrates a transfer function from a near end to a far end node of the leftmost return line of FIG. 19.

For the far end node of the leftmost return line in FIG. 19, the transfer functions in the frequency domain are shown in FIG. 22. Shown are the frequency dependencies for the full system (solid bold), small window hierarchical (solid), small window truncation (dash-dot) and large window truncation (dashed). The transfer function for the hierarchical equivalent circuit matches very well with the result using the full system, while the truncated model (both for small and large window size) does not capture the resonance frequency accurately.

Figure 23:
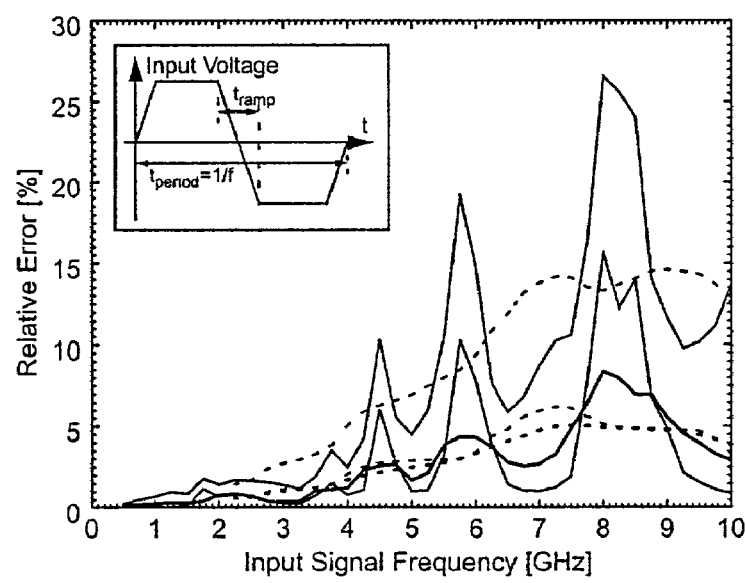
FIG. 23 graphically illustrates the far end node signal error versus signal frequency for the leftmost return line of FIG. 19.

As a consequence, the far end signal error for the truncated models is larger than for the hierarchical model. See FIG. 23, which illustrates the leftmost return line far end node signal error versus signal frequency. The signal is ramp-rectangular wave shown in the upper left ($t_{ramp}=t_{period}/20$). Hierarchical small window (bold), truncated small window (upper thin curve), truncate large window (lower thin curve) are shown. Running averages are shown dotted. For increasing system size, the impact of long distance couplings will increase.

B. Five Signal Lines Over Meshed Ground Plane

Figure 24:
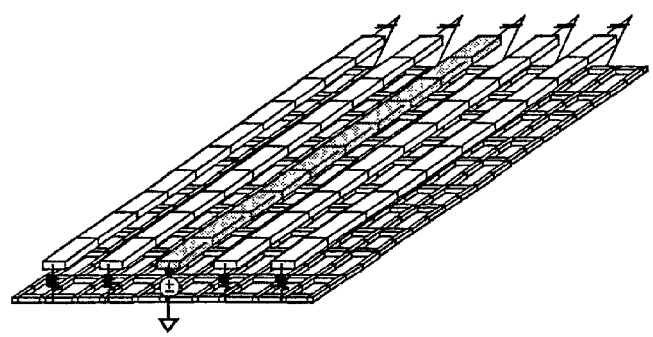
FIG. 24 is a perspective view of five parallel signal lines over a 10×10 mesh ground plane that can be modeled according to embodiments of the present invention.

As a second example, a five line signal bus over a ground plane is used. As shown in FIG. 24, five parallel signal wires over 10×10 meshed ground plane is modeled by a two-dimensional (10×10) filament mesh. For all signal lines, driver resistance is 50 Ω, load capacitance is 2 fF, thickness is 3.5 μm, spacing is 10 μm, length is 1000 μm and width is 10 μm. Spacing to ground plane is 5 μm. System size is about 1005 μm. Materials are copper (ρ=17.5 nΩm) and $SiO_2$ ($\epsilon_r$=3.9, $\mu_r$=1.0). The middle signal line is active.

To accurately model the current and charge distribution for the ground plane, usually a large number of individual filaments is used. The full interconnect parasitic model grows very rapidly even at modest modeling accuracies. A hierarchical approach according to embodiments of the invention can potentially create huge runtime and/or memory savings, by modeling the coupling from the signal lines to larger but more distant patches of the ground plane with only few mutual capacitances and inductances. The same is true for couplings between distant parts of the same ground plane.

Figure 25:
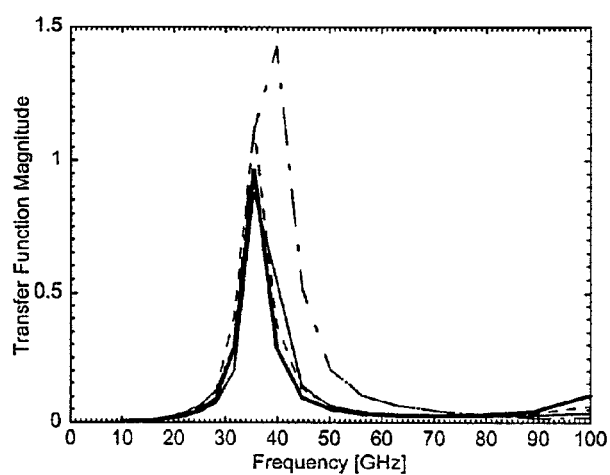
FIG. 25 graphically illustrates a transfer function from the near end to the far end node of the leftmost signal line of FIG. 24.
Figure 26:
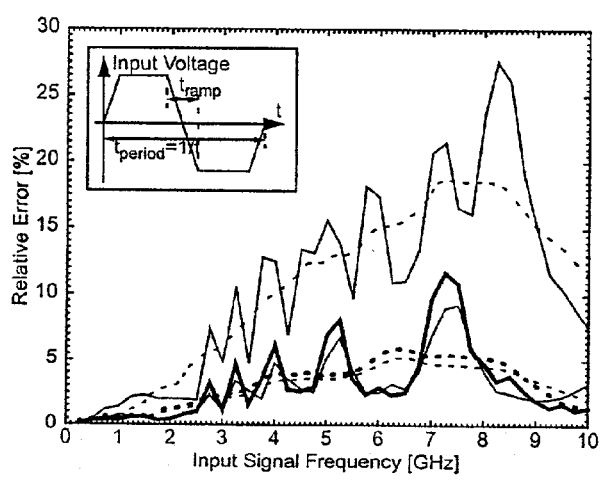
FIG. 26 graphically illustrates the far end node voltage error versus signal frequency for the leftmost signal line of FIG. 24.

FIG. 25 illustrates a transfer function from the near to the far end node of the leftmost signal line in FIG. 24. Shown are the frequency dependencies for the full system (solid bold), small window hierarchical (solid), small window truncation (dash-dot) and large window truncation (dashed). FIG. 26 illustrates the leftmost signal line far end node voltage error versus signal frequency. The signal is a ramp-rectangular wave shown in the upper left ($t_{ramp}=t_{period}/20$). Hierarchical small window (bold), truncate small window (upper thin curve), truncate large window (lower thin curve) are illustrated. Running averages are shown dotted.

In FIGS. 25 and 26, the accuracy of the far end voltage response for the leftmost signal line is compared for truncate-only and hierarchical modeling approaches according to embodiments of the invention. Again, in order to reach similar accuracy for the truncated and the hierarchical electromagnetic model, the truncation window needs to be extended significantly and runtime and/or memory consumption increase. See Table 2.

TABLE 2

|  | Full | Hier. small | Tr. small | Tr. Large |
|---|---|---|---|---|
| Runtime [s] | 1510 | 882 | 315 | 1256 |
| Window Radius [μm] | 1005 | 255 | 255 | 662 |
| Capacitance Elements | 20080 | 7884 | 7325 | 17889 |
| Inductance Elements | 18985 | 6886 | 6641 | 16894 |
| Sparsity | 0% | 62.1% | 64.1% | 10.8% |

CONCLUSIONS

The above description has shown that the increasing size of microelectronic systems combined with deep submicron physical modeling details may create an explosion in RLC interconnect modeling complexity of potentially unmanageable proportions. Interconnect extraction tools employ hierarchy to manage complexity, but this hierarchy generally is discarded by eliminating far away coupling terms when the equivalent RLC circuits are formed. The increasing dominance of capacitance coupling along with the emergence of on-chip inductance, however, may make the composite effect of faraway couplings increasingly evident. Even if newly enforced design rules and practices will ultimately obviate the need for modeling these couplings for design verification, some approximation of the exact solution may be desired to validate these rules.

Embodiments of the invention can provide an efficient hierarchical equivalent circuit representation of interconnect parasitics that can utilize the efficient hierarchical long-distance modeling already existing within extractors. Results from the prototype simulator based on these hierarchical models demonstrated the simulation inaccuracy incurred when the faraway coupling terms are ignored. Such a form of interconnect modeling may provide a key to hierarchical modeling of electromagnetic interactions among large components in future gigascale systems.

Embodiments of the invention can use a global circuit node to represent groups of conductors that can model collective coupling effects efficiently. New RLC circuit models can be created that can facilitate the modeling of interconnect couplings at higher levels of abstraction so that large gigascale systems can be verified without flattening the components to the lowest circuit level. The runtime and/or memory overhead of the hierarchical equivalent circuit models also may be further reduced with respect to truncate only models to make hierarchical models even more efficient.

In addition, the finite propagation time for electromagnetic interactions may become a significant factor for accurate on-chip timing analysis for signal frequencies from a few GHz upward. Handling retardation effects for composite long distance couplings more efficiently may become necessary. Hierarchical equivalent circuit models according to embodiments of the invention may be used to this end as well.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of creating an equivalent circuit of a plurality of interconnects in a microelectronic device, comprising:
   identifying a first group of interconnects in the microelectronic device and a second group of interconnects in the microelectronic device, from the plurality of interconnects;
   modeling aggregate parasitic coupling of the first group of interconnects to the second group of interconnects as a first global circuit node having current and voltage parameters that reflect the aggregate parasitic coupling of the first group of interconnects to the second group of interconnects; and
   using the first global circuit node to create an equivalent circuit of the first group of interconnects.

2. A method according to claim 1 further comprising:
   modeling individual parasitic couplings among interconnects in the second group of interconnects as a plurality of local circuit nodes; and
   wherein the using comprises using the first global circuit node and the plurality of local circuit nodes to create an equivalent circuit of the first group of interconnects.

3. A method according to claim 1 wherein the identifying comprises:
   identifying the first group of interconnects in the microelectronic device having a first group size; and
   identifying the second group of interconnects in the microelectronic device that is spaced apart from the first group of interconnects by more than the first group size.

4. A method according to claim 1 wherein the modeling comprises:
   deriving an aggregate voltage that is generated by the first group of interconnects or an aggregate current that is generated by the first group of interconnects; and
   modeling the first global circuit node as a controlled voltage source having the aggregate voltage or a controlled current source having the aggregate current.

5. A method according to claim 4:
   wherein the deriving an aggregate voltage comprises accumulating node potentials that result from capacitive coupling of the first group of interconnects to the second group of interconnects and distributing branch magnetic fluxes that result from inductive coupling of the first group of interconnects; and
   wherein the deriving an aggregate current comprises distributing node currents that result from capacitive coupling of the first group of interconnects to the second group of interconnects and accumulating branch currents that result from inductive coupling of the first group of interconnects to the second group of interconnects.

6. A method according to claim 1 wherein the using comprises:
   extracting a hierarchically sparse representation of couplings among the first group of interconnects; and
   adding the couplings between the first global circuit node to the hierarchically sparse representation of couplings among the first group of interconnects.

7. A method according to claim 1 further comprising:
   modeling aggregate parasitic coupling of the second group of interconnects to the first group of interconnects as a second global circuit node having current and voltage parameters that reflect the aggregate parasitic coupling of the second group of interconnects to the first group of interconnects;
   using the second global circuit node to create an equivalent circuit of the second group of interconnects;
   identifying a third group of interconnects in the microelectronic device;
   modeling aggregate parasitic coupling of the first and second groups of interconnects to the third group of interconnects as a third global circuit node that is based on the first and second global circuit nodes; and
   using the third global circuit node to create an equivalent circuit of the third group of interconnects.

8. A method according to claim 1 wherein the first group of interconnects comprises a first bus in the microelectronic device and wherein the second group of interconnects comprises a second bus in the microelectronic device.

9. A method according to claim 1 wherein the first group of interconnects comprises a first portion of a bus in the microelectronic device and wherein the second group of interconnects comprises a second portion of the bus in the microelectronic device.

10. A method of creating an equivalent circuit of a plurality of electric and/or electronic circuit components, comprising:
  identifying a first group of components and a second group of components from the plurality of electric and/or electronic components;
  defining at least one first global component and at least one second global component that have global component parameters that reflect aggregate parameters of the first group of components and the second group of components, respectively;
  modeling aggregate interaction between the first group of components and the second group of components as a plurality of interactions between the at least one first global component and the at least one second global component; and
  creating an equivalent circuit of the plurality of components using the first and second groups of components, the at least one first global component, the at least one second global component and the interactions between the at least one first global component and the at least one second global component that are modeled.

11. A method according to claim 10 wherein the creating an equivalent circuit comprises:
  defining at least one third global component that has global component parameters that reflect aggregate parameters of the first and second groups of components and the at least one first and second global components;
  modeling aggregate interaction among the first and second groups of components and others of the plurality of components as a plurality of interactions between the at least one third global component and the others of the plurality of components; and
  creating the equivalent circuit of the plurality of components using the at least one third global component.

12. A method according to claim 10 further comprising:
  modeling individual interactions among components in the second group of components as a plurality of local circuit nodes; and
  wherein the creating further comprises creating an equivalent circuit of the plurality of components using the plurality of local circuit nodes.

13. A method according to claim 10 wherein the identifying comprises:
  identifying the first group of components having a first group size; and
  identifying the second group of components having a second group size and that is spaced apart from the first group of components by more than a smaller of the first group size and the second group size.

14. A method according to claim 10 wherein the modeling comprises:
  deriving aggregate physical parameters that are generated by the first group of components; and
  modeling the first plurality of global components having the aggregate physical parameters of the first group of components.

15. A method according to claim 10 wherein the first group of components comprises a first group of interconnects and wherein the second group of components comprises a second group of interconnects that is remote from the first group of interconnects.

16. A method of creating an equivalent circuit of a plurality of electric and/or electronic circuit components, comprising:
  identifying groups of components from the plurality of electric and/or electronic components; and
  hierarchically modeling aggregate interactions among the groups of components to create increasingly higher level circuit models until the equivalent circuit for the plurality of components is produced, wherein hierarchically modeling comprises:
  defining a plurality of global components that reflect aggregate parameters of the groups of components; and
  modeling aggregate interaction among the groups of components as a plurality of interactions among the plurality of global components.

17. A method according to claim 16 wherein the hierarchically modeling further comprises:
  defining a plurality of next higher level global components that reflect aggregate parameters of at least some of the plurality of global components; and
  modeling aggregate interaction among the groups of components as a plurality of interactions among the plurality of next higher level global components.

18. A method according to claim 16 wherein the identifying comprises:
  identifying groups of components that are remote from one another.

19. A method according to claim 16 wherein the hierarchically modeling comprises hierarchically modeling aggregate parasitic couplings among the groups of components.

20. A system for creating an equivalent circuit of a plurality of interconnects in a microelectronic device, comprising:
  means for identifying a first group of interconnects in the microelectronic device and a second group of interconnects in the microelectronic device from the plurality of interconnects;
  means for modeling aggregate parasitic coupling of the first group of interconnects to the second group of interconnects as a first global circuit node having current and voltage parameters that reflect the aggregate parasitic coupling of the first group of interconnects to the second group of interconnects; and
  means for using the first global circuit node to create an equivalent circuit of the first group of interconnects.

21. A system according to claim 20 further comprising:
  means for modeling individual parasitic couplings among interconnects in the second group of interconnects as a plurality of local circuit nodes; and
  wherein the means for using comprises means for using the first global circuit node and the plurality of local circuit nodes to create an equivalent circuit of the first group of interconnects.

22. A system according to claim 20 wherein the means for identifying comprises:
  means for identifying the first group of interconnects in the microelectronic device having a first group size; and
  means for identifying the second group of interconnects in the microelectronic device that is spaced apart from the first group of interconnects by more than the first group size.

23. A system according to claim 20 wherein the means for modeling comprises:

means for deriving an aggregate voltage that is generated by the first group of interconnects or for deriving an aggregate current that is generated by the first group of interconnects; and means for modeling the first global circuit node as a controlled voltage source having the aggregate voltage or a controlled current source having the aggregate current.

24. A system according to claim 23:

wherein the means for deriving an aggregate voltage comprises means for accumulating node potentials that result from capacitive coupling of the first group of interconnects to the second group of interconnects and for distributing branch magnetic fluxes that result from inductive coupling of the first group of interconnects; and wherein the means for deriving an aggregate current comprises means for distributing node currents that result from capacitive coupling of the first group of interconnects to the second group of interconnects and for accumulating branch currents that result from inductive coupling of the first group of interconnects to the second group of interconnects.

25. A system according to claim 20 wherein the means for using comprises:

means for extracting a hierarchically sparse representation of couplings among the first group of interconnects; and means for adding the couplings between the first global circuit node to the hierarchically sparse representation of couplings among the first group of interconnects.

26. A system according to claim 20 further comprising:

means for modeling aggregate parasitic coupling of the second group of interconnects to the first group of interconnects as a second global circuit node having current and voltage parameters that reflect the aggregate parasitic coupling of the second group of interconnects to the first group of interconnects;

means for using the second global circuit node to create an equivalent circuit of the second group of interconnects;

means for identifying a third group of interconnects in the microelectronic device;

means for modeling aggregate parasitic coupling of the first and second groups of interconnects to the third group of interconnects as a third global circuit node that is based on the first and second global circuit nodes; and means for using the third global circuit node to create an equivalent circuit of the third group of interconnects.

27. A system according to claim 20 wherein the first group of interconnects comprises a first bus in the microelectronic device and wherein the second group of interconnects comprises a second bus in the microelectronic device.

28. A system according to claim 20 wherein the first group of interconnects comprises a first portion of a bus in the microelectronic device and wherein the second group of interconnects comprises a second portion of the bus in the microelectronic device.

29. A system for creating an equivalent circuit of a plurality of electric and/or electronic circuit components, comprising:

means for identifying a first group of components and a second group of components, from the plurality of electric and/or electronic components;

means for defining at least one first global component and at least one second global component that have global component parameters that reflect aggregate parameters of the first group of components and the second group of components, respectively;

means for modeling aggregate interaction between the first group of components and the second group of components as a plurality of interactions between the at least one first global component and the at least one second global component; and means for creating an equivalent circuit of the plurality of components using the first and second groups of components, the at least one first global component, the at least one second global component and the interactions between the at least one first global component and the at least one second global component that are modeled.

30. A system according to claim 29 wherein the means for creating an equivalent circuit comprises:

means for defining at least one third global component that has global component parameters that reflect aggregate parameters of the first and second groups of components and the at least one first and second global components;

means for modeling aggregate interaction among the first and second groups of components and others of the plurality of components as a plurality of interactions between the at least one third global component and the others of the plurality of components; and means for creating the equivalent circuit of the plurality of components using the at least one third global component.

31. A system according to claim 29 further comprising:

means for modeling individual interactions among components in the second group of components as a plurality of local circuit nodes; and wherein the means for creating further comprises means for creating an equivalent circuit of the plurality of components using the plurality of local circuit nodes.

32. A system according to claim 29 wherein the means for identifying comprises:

means for identifying the first group of components having a first group size; and means for identifying the second group of components having a second group size and that is spaced apart from the first group of components by more than a smaller of the first group size and the second group size.

33. A system according to claim 29 wherein the means for modeling comprises:

means for deriving aggregate physical parameters that are generated by the first group of components; and means for modeling the first plurality of global components having the aggregate physical parameters of the first group of components.

34. A system according to claim 29 wherein the first group of components comprises a first group of interconnects and wherein the second group of components comprises a second group of interconnects that is remote from the first group of interconnects.

35. A system for creating an equivalent circuit of a plurality of electric and/or electronic circuit components, comprising:

means for identifying groups of components from the plurality of electric and/or electronic components; and means for hierarchically modeling aggregate interactions among the groups of components to create increasingly higher level circuit models until the equivalent circuit for the plurality of components is produced, wherein the means for hierarchically modeling comprises:

means for defining a plurality of global components that reflect aggregate parameters of the groups of components; and means for modeling aggregate interaction among the groups of components as a plurality of interactions among the plurality of global components.

36. A system according to claim 35 wherein the means for hierarchically modeling further comprises:

means for defining a plurality of next higher level global components that reflect aggregate parameters of at least some of the plurality of global components; and means for modeling aggregate interaction among the groups of components as a plurality of interactions among the plurality of next higher level global components.

37. A system according to claim 35 wherein the means for identifying comprises:

means for identifying groups of components that are remote from one another.

38. A system according to claim 35 wherein the means for hierarchically modeling comprises means for hierarchically modeling aggregate parasitic couplings among the groups of components.

39. A computer program product for creating an equivalent circuit of a plurality of interconnects in a microelectronic device, the computer program product comprising a computer usable storage medium having computer-readable program code embodied in the medium, the computer-readable program code comprising:

computer-readable program code that is configured to identify a first group of interconnects in the microelectronic device and a second group of interconnects in the microelectronic device, from the plurality of interconnects;

computer-readable program code that is configured to model aggregate parasitic coupling of the first group of interconnects to the second group of interconnects as a first global circuit node having current and voltage parameters that reflect the aggregate parasitic coupling of the first group of interconnects to the second group of interconnects; and computer-readable program code that is configured to use the first global circuit node to create an equivalent circuit of the first group of interconnects.

40. A computer program product according to claim 39 further comprising:

computer-readable program code that is configured to model individual parasitic couplings among interconnects in the second group of interconnects as a plurality of local circuit nodes; and wherein the computer-readable program code that is configured to use comprises computer-readable program code that is configured to use the first global circuit node and the plurality of local circuit nodes to create an equivalent circuit of the first group of interconnects.

41. A computer program product according to claim 39 wherein the computer-readable program code that is configured to identify comprises:

computer-readable program code that is configured to identify the first group of interconnects in the microelectronic device having a first group size; and computer-readable program code that is configured to identify the second group of interconnects in the microelectronic device that is spaced apart from the first group of interconnects by more than the first group size.

42. A computer program product according to claim 39 wherein the computer-readable program code that is configured to model comprises:

computer-readable program code that is configured to derive an aggregate voltage that is generated by the first group of interconnects or to derive an aggregate current that is generated by the first group of interconnects; and computer-readable program code that is configured to model the first global circuit node as a controlled voltage source having the aggregate voltage or a controlled current source having the aggregate current.

43. A computer program product according to claim 42:

wherein the computer-readable program code that is configured to derive an aggregate voltage comprises computer-readable program code that is configured to accumulate node potentials that result from capacitive coupling of the first group of interconnects to the second group of interconnects and to distribute branch magnetic fluxes that result from inductive coupling of the first group of interconnects; and wherein the computer-readable program code that is configured to derive an aggregate current comprises computer-readable program code that is configured to distribute node currents that result from capacitive coupling of the first group of interconnects to the second group of interconnects and computer-readable program code that is configured to accumulate branch currents that result from inductive coupling of the first group of interconnects to the second group of interconnects.

44. A computer program product according to claim 39 wherein the computer program product that is configured to use comprises:

computer-readable program code that is configured to extract a hierarchically sparse representation of couplings among the first group of interconnects; and computer-readable program code that is configured to add the couplings between the first global circuit node to the hierarchically sparse representation of couplings among the first group of interconnects.

45. A computer program product according to claim 39 further comprising:

computer-readable program code that is configured to model aggregate parasitic coupling of the second group of interconnects to the first group of interconnects as a second global circuit node having current and voltage parameters that reflect the aggregate parasitic coupling of the second group of interconnects to the first group of interconnects;

computer-readable program code that is configured to use the second global circuit node to create an equivalent circuit of the second group of interconnects;

computer-readable program code that is configured to identify a third group of interconnects in the microelectronic device;

computer-readable program code that is configured to model aggregate parasitic coupling of the first and second groups of interconnects to the third group of interconnects as a third global circuit node that is based on the first and second global circuit nodes; and computer-readable program code that is configured to use the third global circuit node to create an equivalent circuit of the third group of interconnects.

46. A computer program product according to claim 39 wherein the first group of interconnects comprises a first bus in the microelectronic device and wherein the second group of interconnects comprises a second bus in the microelectronic device.

47. A computer program product according to claim 39 wherein the first group of interconnects comprises a first portion of a bus in the microelectronic device and wherein the second group of interconnects comprises a second portion of the bus in the microelectronic device.

48. A computer program product for creating an equivalent circuit of a plurality of electric and/or electronic circuit components, the computer program product comprising a computer usable storage medium having computer-readable program code embodied in the medium, the computer-readable program code comprising:
    computer-readable program code that is configured to identify a first group of components and a second group of components, from the plurality of electric and/or electronic components;
    computer-readable program code that is configured to define at least one first global component and at least one second global component that have global component parameters that reflect aggregate parameters of the first group of components and the second group of components, respectively;
    computer-readable program code that is configured to model aggregate interaction between the first group of components and the second group of components as a plurality of interactions between the at least one first global component and the at least one second global component; and
    computer-readable program code that is configured to create an equivalent circuit of the plurality of components using the first and second groups of components, the at least one first global component, the at least one-second global component and the interactions between the at least one first global component and the at least one second global component that are modeled.

49. A computer program product according to claim 48 wherein the computer-readable program code that is configured to create an equivalent circuit comprises:
    computer-readable program code that is configured to define at least one third global component that has global component parameters that reflect aggregate parameters of the first and second groups of components and the at least one first and second global components;
    computer-readable program code that is configured to model aggregate interaction among the first and second groups of components and others of the plurality of components as a plurality of interactions between the at least one third global component and the others of the plurality of components; and
    computer-readable program code that is configured to create the equivalent circuit of the plurality of components using the at least one third global component.

50. A computer program product according to claim 48 further comprising:
    computer-readable program code that is configured to model individual interactions among components in the second group of components as a plurality of local circuit nodes; and
    wherein the computer-readable program code that is configured to create further comprises computer-readable program code that is configured to create an equivalent circuit of the plurality of components using the plurality of local circuit nodes.

51. A computer program product according to claim 48 wherein the computer-readable program code that is configured to identify comprises:
    computer-readable program code that is configured to identify the first group of components having a first group size; and
    computer-readable program code that is configured to identify the second group of components having a second group size and that is spaced apart from the first group of components by more than a smaller of the first group size and the second group size.

52. A computer program product according to claim 48 wherein the computer-readable program code that is configured to model comprises:
    computer-readable program code that is configured to derive aggregate physical parameters that are generated by the first group of components; and
    computer-readable program code that is configured to model the first plurality of global components having the aggregate physical parameters of the first group of components.

53. A computer program product according to claim 48 wherein the first group of components comprises a first group of interconnects and wherein the second group of components comprises a second group of interconnects that is remote from the first group of interconnects.

54. A computer program product for creating an equivalent circuit of a plurality of electric and/or electronic circuit components, the computer program product comprising a computer usable storage medium having computer-readable program code embodied in the medium, the computer-readable program code comprising:
    computer-readable program code that is configured to identify groups of components from the plurality of electric and/or electronic components; and
    computer-readable program code that is configured to hierarchically model aggregate interactions among the groups of components to create increasingly higher level circuit models until the equivalent circuit for the plurality of components is produced, wherein the computer-readable program code that is configured to hierarchically model comprises:
    computer-readable program code that is configured to define a plurality of global components that reflect aggregate parameters of the groups of components; and
    computer-readable program code that is configured to model aggregate interaction among the groups of components as a plurality of interactions among the plurality of global components.

55. A computer program product according to claim 54 wherein the computer-readable program code that is configured to hierarchically model further comprises:
    computer-readable program code that is configured to define a plurality of next higher level global components that reflect aggregate parameters of at least some of the plurality of global components; and
    computer-readable program code that is configured to model aggregate interaction among the groups of components as a plurality of interactions among the plurality of next higher level global components.

56. A computer program product according to claim 54 wherein the computer-readable program code that is configured to identify comprises:

computer-readable program code that is configured to identify groups of components that are remote from one another.

57. A computer program product according to claim 54 wherein the computer-readable program code that is configured to hierarchically model comprises computer-readable program code that is configured to hierarchically model aggregate parasitic couplings among the groups of components.

* * * * *